(12) United States Patent
Choi et al.

(10) Patent No.: US 11,678,537 B2
(45) Date of Patent: Jun. 13, 2023

(54) DISPLAY APPARATUS

(71) Applicant: Samsung Display Co., Ltd., Yongin-Si (KR)

(72) Inventors: Deokyoung Choi, Yongin-si (KR); Deukjong Kim, Yongin-si (KR); Changmin Song, Yongin-si (KR); Byeongguk Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/445,717

(22) Filed: Aug. 23, 2021

(65) Prior Publication Data
US 2022/0157913 A1 May 19, 2022

(30) Foreign Application Priority Data

Nov. 18, 2020 (KR) ......................... 10-2020-0154574

(51) Int. Cl.
*H01L 27/32* (2006.01)
*G06F 3/041* (2006.01)
*G06F 3/044* (2006.01)

(52) U.S. Cl.
CPC ........ *H01L 27/3276* (2013.01); *G06F 3/0412* (2013.01); *G06F 3/0446* (2019.05); *H01L 27/323* (2013.01)

(58) Field of Classification Search
CPC ............. H01L 27/3276; H01L 27/3258; H01L 27/323; H01L 27/3216; H01L 27/3218; G06F 3/04164; G06F 3/0412; G06F 3/0446; G06F 2203/04111; G06F 3/0443; G06F 2203/04112; G06F 3/0445

See application file for complete search history.

(56) References Cited

U.S. PATENT DOCUMENTS

| 8,120,246 B2 | 2/2012 | Shibasaki et al. |
| 9,356,085 B2 | 5/2016 | Kim |
| 9,412,801 B2 | 8/2016 | Choi |
| 10,879,319 B2 | 12/2020 | Bang et al. |
| 2019/0006442 A1* | 1/2019 | Byun .................. H01L 27/3246 |
| 2021/0296610 A1* | 9/2021 | Chen ..................... G06F 3/0412 |

FOREIGN PATENT DOCUMENTS

| KR | 10-0719599 B1 | 5/2007 |
| KR | 10-1161443 B1 | 7/2012 |
| KR | 10-2015-0016784 A | 2/2015 |
| KR | 10-1521676 B1 | 5/2015 |
| KR | 10-2020-0032291 A | 3/2020 |

* cited by examiner

*Primary Examiner* — Deeprose Subedi
(74) *Attorney, Agent, or Firm* — Innovation Counsel LLP

(57) ABSTRACT

An embodiment of a display apparatus includes: a substrate; display elements disposed in a display area; a common power supply wire disposed in a peripheral area; an organic insulating layer overlapping the power supply wire; and a power supply electrode layer overlapping the power supply wire. In an embodiment, the power supply electrode layer is arranged in the peripheral area includes an inner edge and an outer edge, and a distance between a portion of the inner edge and the display area is greater than a distance between another portion of the inner edge and the display area.

14 Claims, 14 Drawing Sheets

DISPLAY APPARATUS

CROSS-REFERENCE TO RELATED APPLICATION

This application is based on and claims priority under 35 U.S.C. § 119 to Korean Patent Application No. 10-2020-0154574, filed on Nov. 18, 2020, in the Korean Intellectual Property Office, the disclosure of which is incorporated by reference herein in its entirety.

BACKGROUND

1. Field

The present disclosure relates to a display apparatus.

2. Description of the Related Art

Mobile electronic devices are widely used. As mobile electronic devices, tablet PCs have been widely used in recent years in addition to small electronic devices such as mobile phones.

Such mobile electronic devices include display apparatuses to provide various functions, for example, visual information such as images or video, to a user. Recently, with the miniaturization of components for driving display apparatuses, the area occupied by display apparatuses in electronic devices has been gradually increasing, and thus, the demand for high-resolution display apparatuses is increasing.

Among display apparatuses, organic light-emitting display apparatuses have advantages such as wide viewing angles, excellent contrast, and fast response speeds, and thus their range of applications has expanded and they are widely used.

SUMMARY

According to one or more embodiments, a display apparatus includes: a substrate including a display area and a peripheral area, display elements disposed in the display area, each display element includes a pixel electrode, an opposite electrode, and an intermediate layer between the pixel electrode and the opposite electrode; a common power supply wire disposed in the peripheral area; an organic insulating layer disposed on the substrate; and a power supply electrode layer overlapping the power supply wire and partially arranged on the organic insulating layer, wherein a space separates the power supply electrode layer from the display area, the power supply electrode layer includes an inner edge facing the display area and an outer edge opposite the inner edge, a distance between a portion of the inner edge and the display area is greater than a distance between another portion of the inner edge and the display area, and the portion of the inner edge is located at a corner portion of the peripheral area.

The power supply electrode layer and a pixel electrode of each of the plurality of display elements comprise a same material.

The display apparatus may further include a power supply conductive layer between the common power supply wire and the power supply electrode layer, wherein the power supply conductive layer electrically connects the common power supply wire to the power supply electrode layer.

The display apparatus may further include pixel circuits located in the display area, the pixel circuits electrically connects to the display elements, a driving circuit portion located in the peripheral area, and connection wires disposed in the peripheral area and electrically connecting the driving circuit portion.

The plurality of connection wires and the power supply conductive layer comprise a same material.

The connection wires may include first connection wires extending in a straight line from the driving circuit portion toward the display area, and second connection wires extending from the driving circuit portion toward the display area, at least a portion of the second connection wires being bent.

The second connection wires of the may be located at a corner portion of the peripheral area.

A gap between the second connection wires may be smaller than a gap between the first connection wires.

A space between the portion of the inner edge of the power supply conductive layer and the display area may overlap a portion of the second connection wires.

The space between the portion of the inner edge of the power supply conductive layer and the display area may overlap a portion of the common power supply wire.

The display apparatus may further include an encapsulation layer covering the display elements, and including an inorganic layer and an organic layer.

The display apparatus may further include an input sensing layer arranged on the encapsulation layer and including sensing electrodes and trace lines electrically connected to the sensing electrodes.

A space between the portion of the inner edge of the power supply electrode layer and the display area may overlap a portion of the trace lines of the input sensing layer.

The power supply electrode layer may include arranged to overlap the organic insulating layer.

According to one or more embodiments, a display apparatus includes: a substrate including a display area and a peripheral area; display elements disposed in the display area; a common power supply wire disposed in the peripheral area; a first organic insulating layer disposed above the substrate; and a power supply conductive layer disposed above the first organic insulating layer, wherein the power supply conductive layer includes first holes overlapping the first organic insulating layer.

The display apparatus may include; a second organic insulating layer disposed above the first organic insulating layer and overlapping the power supply conductive layer; and a power supply electrode layer disposed above the second organic insulating layer and electrically connected to the power supply conductive layer, wherein the power supply electrode layer includes second holes overlapping the second insulating layer.

The display apparatus may include a pixel defining layer disposed above the second organic insulating layer and overlapping the power supply electrode layer.

According to one or more embodiments, a display apparatus includes: a substrate including a display area and a peripheral area; a common power supply wire disposed in the peripheral area; an organic insulating layer disposed on the substrate; a power supply electrode layer disposed in the peripheral area and overlapping the organic insulating layer, the power supply electrode layer is spaced apart from the display area on a plane; display elements arranged on the substrate and each including a pixel electrode, an opposite electrode, and an intermediate layer between the pixel electrode and the opposite electrode; an encapsulation layer covering the plurality of display elements; and an input sensing layer arranged on the encapsulation layer and including sensing electrodes and trace lines electrically connected to the sensing electrodes; wherein the peripheral area includes a first peripheral area extending in a first direction, a second peripheral area extending in a second direction intersecting with the first direction, and a corner peripheral area connecting the first peripheral area and the second peripheral area with each other, wherein, on a plane, at least a portion of the power supply electrode layer located in the corner peripheral area is spaced farther away from the display area than a portion of the power supply electrode layer located in the first peripheral area.

The display apparatus may further include a driving circuit portion arranged in the peripheral area, at least a portion of the driving circuit portion being located in the corner peripheral area, and connection wires extending from the driving circuit portion toward the display area, wherein the connection wires include first connection wires extending in a straight line and second connection wires that are at least partially bent and located in the corner peripheral area.

A gap between the second connection wires of the plurality of connection wires may be smaller than a gap between the first connection wires of the plurality of connection wires.

On a plane, a portion of the second connection wires and a portion of the common power supply wire may be located between at least a portion of the power supply electrode layer and the display area.

The power supply electrode layer and a pixel electrode of each of the plurality of display elements may include a same material.

Other aspects, features, and advantages other than those described above will become apparent from the detailed content, claims and drawings for carrying out the following embodiments.

These general and specific aspects may be implemented by using a system, a method, a computer program, or any combinations thereof.

BRIEF DESCRIPTION OF THE DRAWINGS

The above and other aspects, features, and advantages of embodiments of the present disclosure will be more apparent from the following description taken in conjunction with the accompanying drawings, in which.

DETAILED DESCRIPTION

Figure 1:
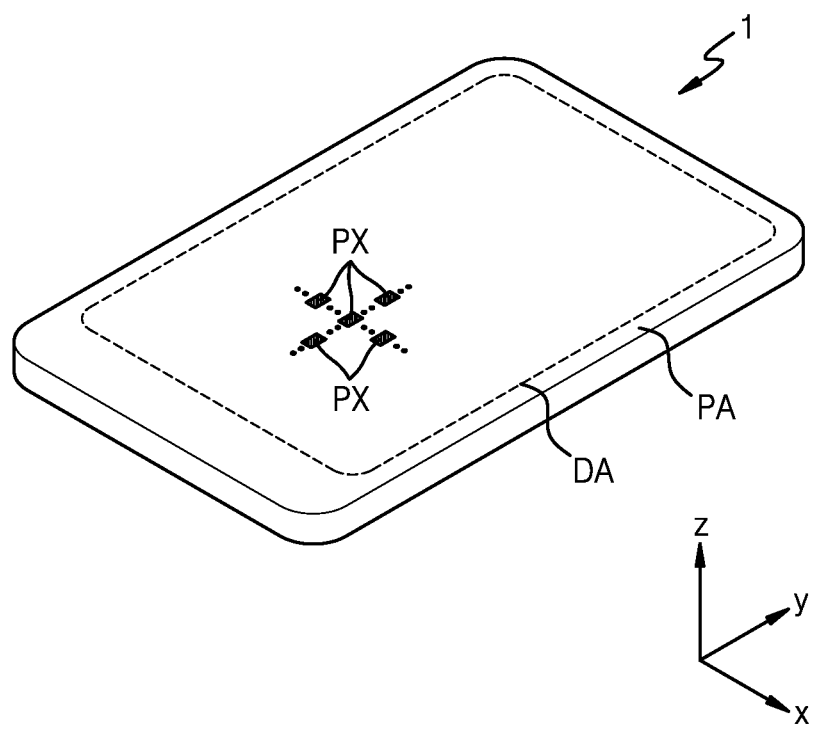
FIG. 1 is a schematic plan view of a display apparatus according to an embodiment.

Reference will now be made in detail to embodiments, examples of which are illustrated in the accompanying drawings, wherein like reference numerals refer to like elements throughout the disclosure. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b, or c" indicates only a, only b, only c, both a and b, both a and c, both b and c, all of a, b, and c, or any variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

The singular forms "a," "an," and "the" as used herein are intended to include the plural forms as well unless the context clearly indicates otherwise.

It will be understood that the terms "including," "having," and "comprising" are intended to indicate the existence of the features or elements described in the following embodiments, and are not intended to preclude the possibility that one or more other features or elements may exist or may be added.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or may be performed in an order opposite to the described order.

"A and/or B" is used herein to select only A, select only B, or select both A and B. "At least one of A and B" is used to select only A, select only B, or select both A and B.

It will be further understood that, when layers, regions, or elements are referred to as being connected to each other, they may be directly connected to each other or indirectly connected to each other with intervening layers, regions, or elements therebetween. For example, when a layer, a region, or an element is referred to as being "electrically connected," it may be directly electrically connected, and/or may be indirectly electrically connected with intervening layers, regions, or elements therebetween.

The x-axis, the y-axis and the z-axis are not limited to three axes of the rectangular coordinate system, and may be interpreted in a broader sense. For example, the x-axis, the y-axis, and the z-axis may be perpendicular to one another or may represent different directions that are not perpendicular to one another.

FIG. 1 is a schematic plan view of a display apparatus 1 according to an embodiment.

Referring to FIG. 1, the display apparatus 1 may include a display area DA and a peripheral area PA outside the display area DA. The display apparatus 1 may provide an image through an array of a plurality of pixels PX that are two-dimensionally arranged in the display area DA. The pixels PX may be defined as an emission area through which a display element driven by a pixel circuit emits light. That is, an image may be provided by light emitted by the display element through the pixels PX. An area in which the image is provided is determined by an arrangement of a plurality of display elements, and the display area DA may be determined by the display elements.

The display area DA may have various shapes on a plane, such as a circular shape, an elliptical shape, a polygonal shape, and shapes of specific figures. FIG. 1 illustrates that the display area DA has a substantially rectangular shape in which corners are round. Hereinafter, for convenience of description, a case where the display area DA has a substantially rectangular shape with round corners will be mainly described.

The peripheral area PA is an area that does not provide an image and may partially or entirely surround the display area DA. A driver or the like that provides electrical signals or power to the display area DA may be arranged in the peripheral area PA.

Hereinafter, it will be described that the display apparatus 1 includes an organic light-emitting diode (OLED) as a display element, but the display apparatus 1 of the disclosure is not limited thereto. According to another embodiment, the display apparatus 1 may include a light-emitting display apparatus including an inorganic light-emitting diode, that is, an inorganic light-emitting display. According to another embodiment, the display apparatus 1 may include a quantum dot light-emitting display.

The display apparatus 1 may be used as display screens for various products such as not only portable electronic devices, such as mobile phones, smart phones, tablet personal computers (PCs), mobile communication terminals, electronic notebooks, e-books, portable multimedia players (PMPs), navigations, and ultra-mobile PCs (UMPCs), and but also televisions (TVs), laptops, monitors, billboards, and Internet of Things (IoT) devices. According to an embodiment, the display apparatus 1 may also be used in wearable devices, such as smart watches, watch phones, glasses-type displays, or head mounted displays (HMDs). According to an embodiment, the display apparatus 1 may also be used as dashboards of automobiles, center information displays (CIDs) of the center fascia or dashboards of automobiles, room mirror displays that replace the side mirrors of automobiles, and display screens arranged on the rear sides of front seats to serve as entertainment devices for back seat passengers of automobiles.

Figure 2:
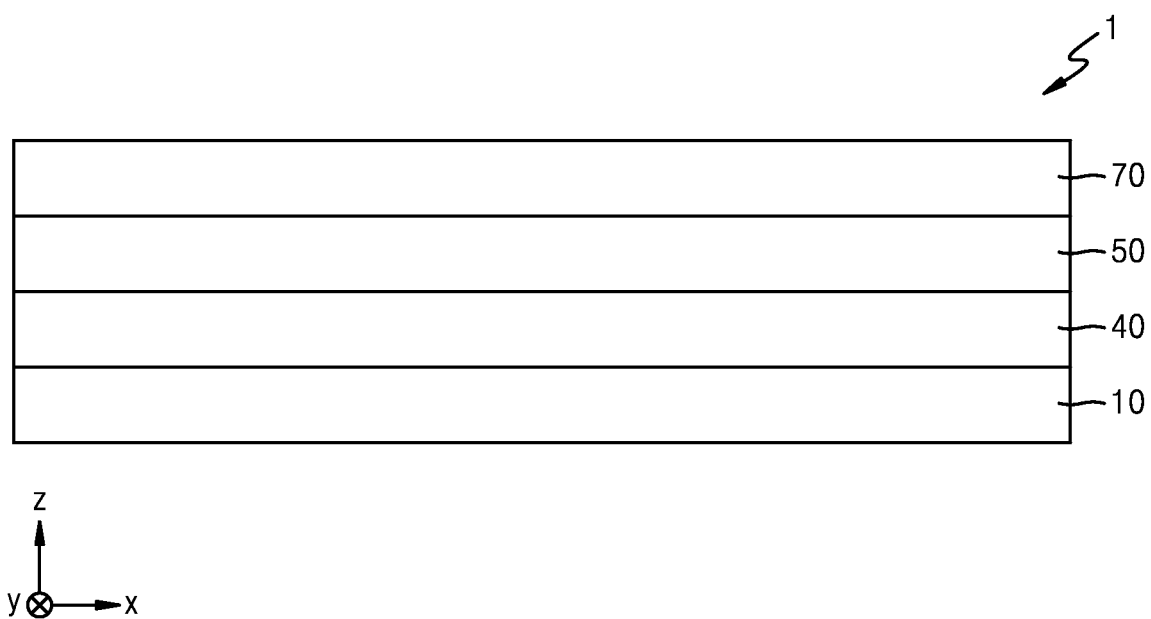
FIG. 2 is a schematic cross-sectional view of a display apparatus according to an embodiment.

FIG. 2 is a schematic cross-sectional view of a display apparatus 1 according to an embodiment.

Referring to FIG. 2, the display apparatus 1 may include a display panel 10, and an input sensing layer 40 and an optical functional layer 50, which are on the display panel 10. The display panel 10, the input sensing layer 40, and the optical functional layer 50 may be covered with a cover window 70.

The display panel 10 may include a plurality of display elements and a plurality of pixel circuits electrically connected to the display elements, and may provide an image through light emitted from the display elements as described above.

The input sensing layer 40 may obtain coordinate information according to an external input, for example, a touch event. The input sensing layer 40 may include sensing electrodes (or touch electrodes) and trace lines electrically connected to the sensing electrodes. The input sensing layer 40 may be on the display panel 10. The input sensing layer 40 may sense an external input using a mutual capacitance method or a self-capacitance method.

The input sensing layer 40 may be formed directly on the display panel 10. Alternatively, the input sensing layer 40 may be formed separately and then bonded through an adhesive member (not shown). As the adhesive member, any general members known in the art may be used without limitation. The adhesive member may include an optical clear adhesive (OCA). According to an embodiment, as illustrated in FIG. 2, the input sensing layer 40 may be formed directly on the display panel 10. In this case, the adhesive member may not be between the input sensing layer 40 and the display panel 10.

The optical functional layer 50 may include an anti-reflective layer. The anti-reflective layer may reduce reflectance of light (external light) incident from the outside toward the display panel 10 through the cover window 70. The anti-reflective layer may include a retarder and a polarizer. The retarder may include a film-type retarder or a liquid crystal coating-type retarder and may include a $\lambda/2$ retarder and/or a $\lambda/4$ retarder. Also, the polarizer may include a film-type polarizer or a liquid crystal coating-type polarizer. The film-type polarizer may include a stretched synthetic resin film, and the liquid crystal coating-type polarizer may include liquid crystals arranged in a certain array. The retarder and the polarizer may further include a protective film.

In another embodiment, the anti-reflective layer may include a structure of a black matrix and color filters. The color filters may be arranged considering the color of light emitted from each pixel of the display panel 10. In another embodiment, the anti-reflective layer may include a destructive interference structure. The destructive interference structure may include a first reflective layer and a second reflective layer, which are on different layers from each other. First reflected light and second reflected light, which are respectively reflected from the first reflective layer and the second reflective layer, may destructively interfere with each other. Thus, the reflectance of external light is reduced.

The optical functional layer 50 may include a lens layer. The lens layer may improve the light emission efficiency of light emitted from the display panel 10 or may reduce color deviation. The lens layer may include a layer having a concave or convex lens shape, or may include a plurality of layers having different refractive indices from each other. The optical functional layer 50 may include either or both of the anti-reflective layer and the lens layer described above.

An adhesive member (not shown) may be between the input sensing layer 40 and the optical functional layer 50. As the adhesive member, any general members known in the art may be used without limitation. The adhesive member may include an OCA.

The cover window 70 may have a high transmittance so as to transmit light emitted from the display panel 10 and may have a small thickness so as to minimize or reduce the weight of the display apparatus 1. Also, in order to protect the display panel 10 from external impact, the cover window 70 may have strong strength and hardness and may have high impact resistance and scratch resistance.

An adhesive layer (not shown) may be between the input sensing layer 40 and the cover window 70 and between the optical functional layer 50 and the cover window 70. The cover window 70 may be bonded to an underlying element, for example, the optical functional layer 50, through the adhesive layer. In an embodiment, the adhesive layer may include an OCA.

Figure 3A:
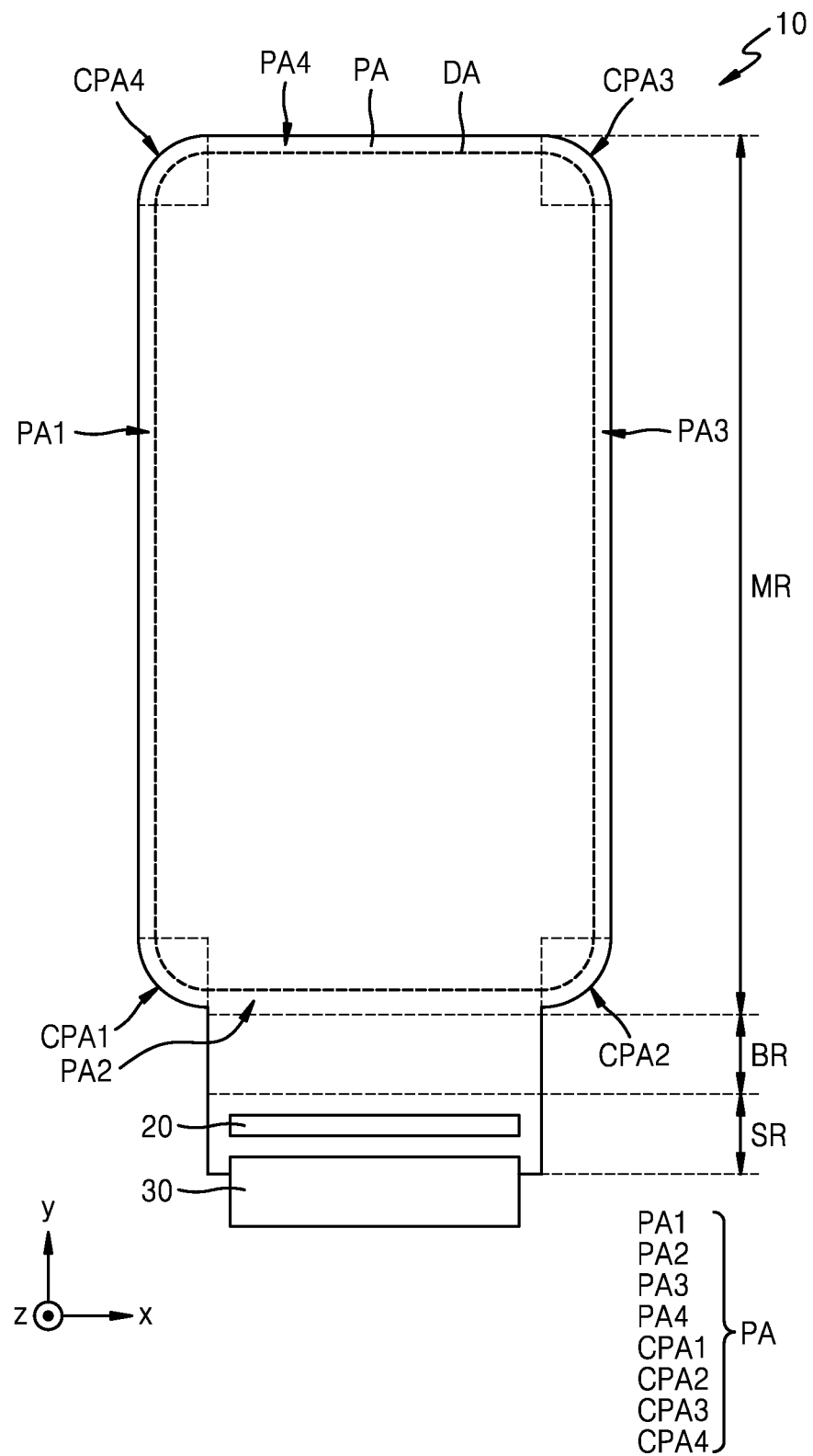
FIG. 3A is a schematic plan view of a display panel of a display apparatus, according to an embodiment.
Figure 3B:
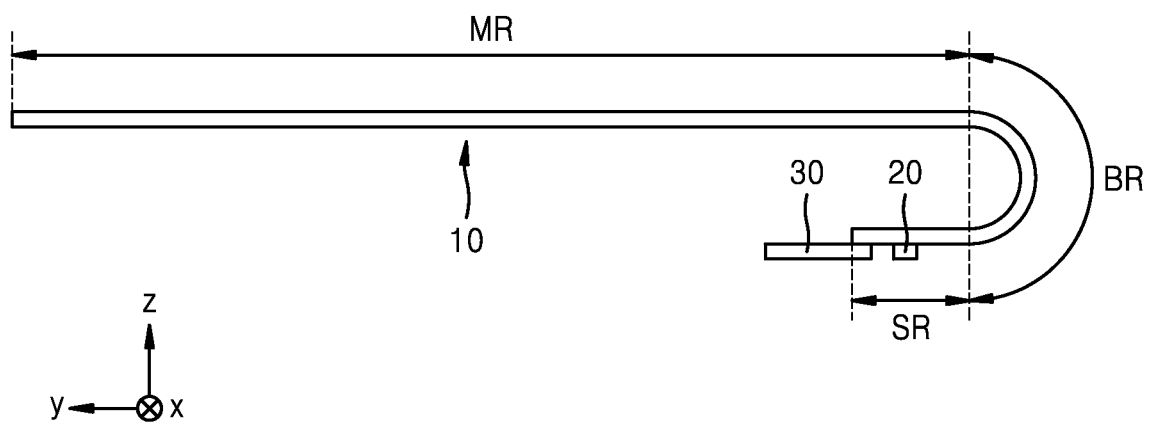
FIG. 3B is a schematic side view of a display panel of FIG. 3A.

FIG. 3A is a schematic plan view of a display panel 10 of a display apparatus, according to an embodiment, and FIG. 3B is a schematic side view of a display panel 10 of FIG. 3A. A portion of the display panel 10 according to the embodiment is bent, but FIG. 3A illustrates that the display panel 10 is not bent for convenience of description.

Referring to FIGS. 3A and 3B, the display panel 10 may include a display area DA and a peripheral area PA outside the display area DA. The display area DA and the peripheral area PA of the display panel 10 may respectively correspond to the display area DA and the peripheral area PA of the display apparatus 1 (see FIG. 1) described above with reference to FIG. 1. The peripheral area PA of the display panel 10 may correspond to the peripheral area PA of the display apparatus 1.

The peripheral area PA may be arranged outside the display area DA. The peripheral area PA may include a first peripheral area PA1, a second peripheral area PA2, a third peripheral area PA3, and a fourth peripheral area PA4, which are arranged on one side of the display area DA. The first peripheral area PA1 and the third peripheral area PA3 are arranged on both sides of the display area DA with the display area DA therebetween and may each extend along a first direction (e.g., a +y direction). The second peripheral area PA2 and the fourth peripheral area PA4 are arranged on both sides of the display area DA with the display area DA therebetween and may each extend along a second direction (e.g., a +x direction) intersecting with the first direction. The second peripheral area PA2 may also extend in the first direction (e.g., the +y direction) to secure a bending region BR and a sub-region SR, which will be described below.

Also, the peripheral area PA may include a first corner peripheral area CPA1, a second corner peripheral area CPA2, a third corner peripheral area CPA3, and a fourth corner peripheral area CPA4, which are arranged to be adjacent to four corner portions of the display area DA. The first to fourth corner peripheral areas CPA1, CPA2, CPA3, and CPA4 may be understood as corner portions of the peripheral area PA. As described above, because the display apparatus 1 and the display panel 10 have a substantially rectangular shape with round corners on a plane, the first to fourth corner peripheral areas CPA1, CPA2, CPA3, and CPA4 may have an overall curved shape on a plane. The first corner peripheral area CPA1 may connect the first peripheral area PA1 and the second peripheral area PA2 to each other. Similarly, the second corner peripheral area CPA2 may connect the second peripheral area PA2 and the third peripheral area PA3 to each other, the third corner peripheral area CPA3 may connect the third peripheral area PA3 and the fourth peripheral area PA4 to each other, and the fourth corner peripheral area CPA4 may connect the fourth peripheral area PA4 and the first peripheral area PA1 to each other.

A width of the second peripheral area PA2 may be narrower than a width of the display area DA. This may be for facilitating bending of a portion of the second peripheral area PA2, as described below.

The display panel 10 may also include a main region MR, the bending region BR arranged on one side of the main region MR, and the sub-region SR located on an opposite side of the main region MR with respect to the bending region BR. In the bending region BR, as illustrated in FIG. 3B, the display panel 10 is bent, so that at least a portion of the sub-region SR overlaps the main region MR when viewed in a z-axis direction. One or more embodiments are not limited to a bent display apparatus and may be applied to a display apparatus that is not bent.

The sub-region SR may be a non-display apparatus as described below. The display panel 10 is bent in the bending region BR, so that, when the display apparatus 1 (see FIG. 1) is viewed from a front surface (in a −z direction), a non-display area may be prevented from being visible, or a visible area may be minimized even though the non-display area is visible.

A data driver 20 may be arranged in the sub-region SR of the display panel 10. The data driver 20 may include an integrated circuit (e.g., a driving chip) that drives the display panel 10. The integrated circuit may be a data driving integrated circuit that generates a data signal, but one or more embodiments are not limited thereto.

The data driver 20 may be mounted on the sub-region SR of the display panel 10. The data driver 20 is mounted on a same surface as a display surface of the display area DA, but when the display panel 10 is bent in the bending region BR as described above, the data driver 20 may be located on a rear surface of the main region MR.

A printed circuit board 30 or the like may be attached to an end portion of the sub-region SR of the display panel 10. The printed circuit board 30 or the like may be electrically connected to the data driver 20 or the like through a pad portion.

FIGS. 3A and 3B illustrate a structure in which the data driver 20 is arranged on the peripheral area PA, but one or more embodiments are not limited thereto. In another embodiment, a structure in which the data driver 20 is arranged on a flexible printed circuit board (FPCB) may also be implemented.

Figure 4:
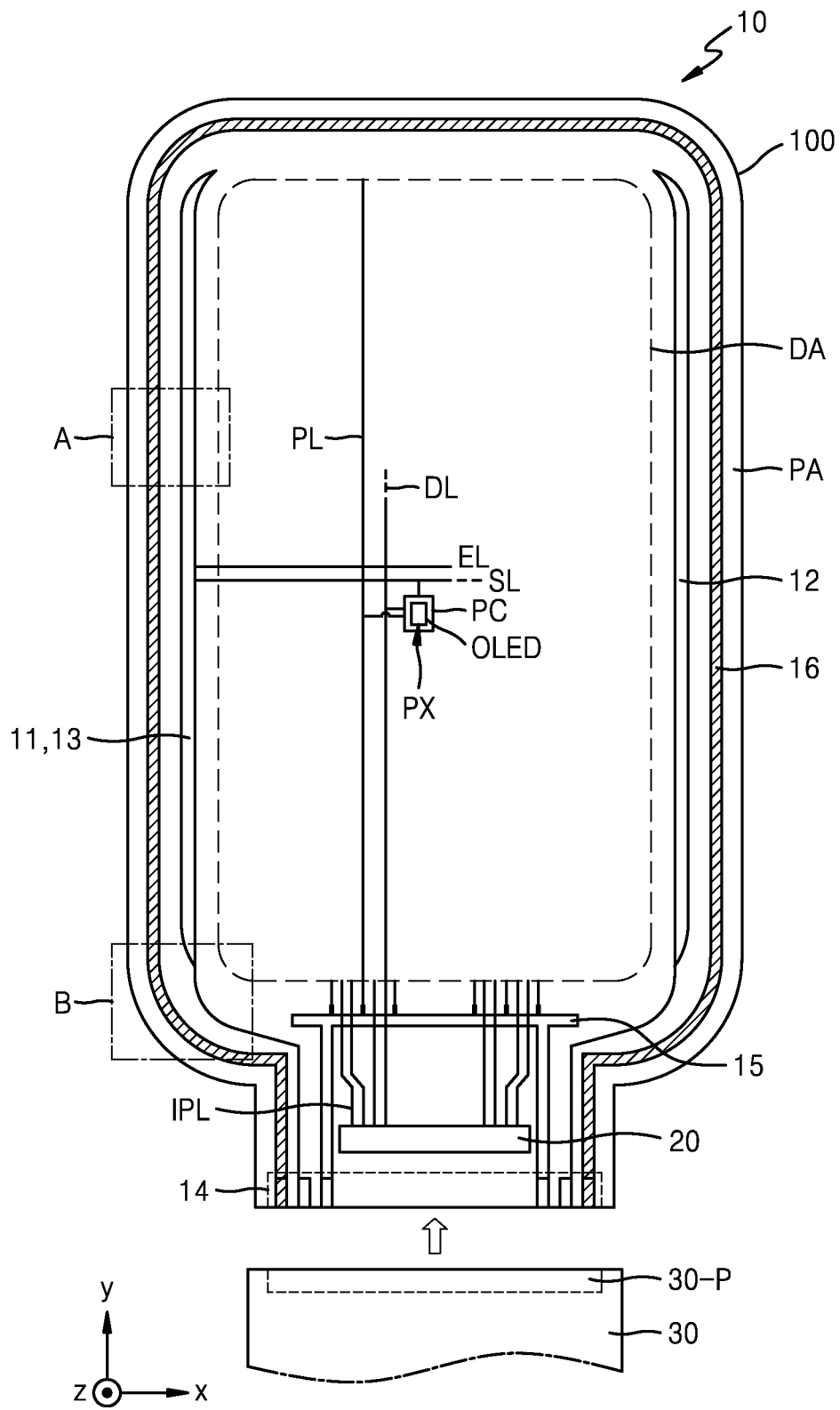
FIG. 4 is a schematic plan view of a display panel according to an embodiment.

FIG. 4 is a schematic plan view of a display panel 10 of a display apparatus, according to an embodiment.

Referring to FIG. 4, the display panel 10 may include a substrate 100. Various elements constituting the display panel 10 may be arranged on the substrate 100. For example, a plurality of pixel circuits PC, organic light-emitting diodes OLED respectively corresponding to the pixel circuits PC, and a plurality of signal lines passing through the display area DA may be arranged on the substrate 100. As described above, an emission area in which the organic light-emitting diodes OLED that are display elements emit light may be defined as a pixel PX, and accordingly, a plurality of pixels PX may be arranged in the display area DA. In this case, the pixels PX refer to sub-pixels, and one pixel PX may emit, for example, red, green, blue, or white light.

The pixel circuits PC may be electrically connected to external driving circuits arranged in the peripheral area PA and may receive electrical signals from the external driving circuits. For example, a first scan driving circuit 11, a second scan driving circuit 12, an emission control driving circuit 13, a pad portion 14, a driving power supply wire 15, and a common power supply wire 16 may be arranged in the peripheral area PA.

The first scan driving circuit 11 may provide a scan signal to the pixels PX through a scan line SL. The second scan driving circuit 12 may be arranged parallel to the first scan driving circuit 11 with the display area DA therebetween. Some of the pixels PX arranged in the display area DA may be electrically connected to the first scan driving circuit 11, and others may be electrically connected to the second scan driving circuit 12. In another embodiment, the second scan driving circuit 12 may be omitted.

The emission control driving circuit 13 may be arranged close to the first scan driving circuit 11 and may provide an emission control signal to the pixels PX through an emission control line EL. FIG. 4 illustrates that the emission control driving circuit 13 is arranged only on one side of the display area DA, but the emission control driving circuit 13 may be arranged on both sides of the display area DA, as in the first and second driving circuits 11 and 12.

The pad portion 14 may be arranged in the second peripheral area PA2 of the substrate 100. The pad portion 14 may be exposed without being covered with insulating layers on the substrate 100 and may be electrically connected to a printed circuit board 30. A pad portion 30-P of the printed circuit board 30 may be in contact with and electrically connected to the pad portion 14 of the display panel 10.

The printed circuit board 30 may transmit a signal or power of a controller (not shown) to the display panel 10. A control signal generated by the controller may be transmitted to the first and second scan driving circuits 11 and 12, and the emission control driving circuit 13 through the printed circuit board 30. Also, the controller may provide the driving power voltage ELVDD (see FIG. 5) and the common power voltage ELVSS (FIG. 5) to the driving power supply wire 15 and the common power supply wire 16, respectively. The driving power voltage ELVDD may be provided to each pixel PX through a driving voltage line PL electrically connected to the driving power supply wire 15, and the common power voltage ELVSS may be provided to an opposite electrode of a pixel PX electrically connected to the common power supply wire 16. The driving power supply wire 15 may extend in one direction (e.g., an x-direction) from below of a display area DA. The common power supply wire 16 may partially surround the display area DA in a loop shape with one side open.

Also, the controller generates a data signal, and the generated data signal may be transmitted to an input line IPL through the data driver 20 and transmitted to the pixels PX through a data line DL connected to the input line IPL. As an example, the input lines IPL may be provided in a fan-out wiring structure, in which an extended length of the data driver 20 in the +x direction is smaller than a width of the display area DA in the +x direction.

Figure 5:
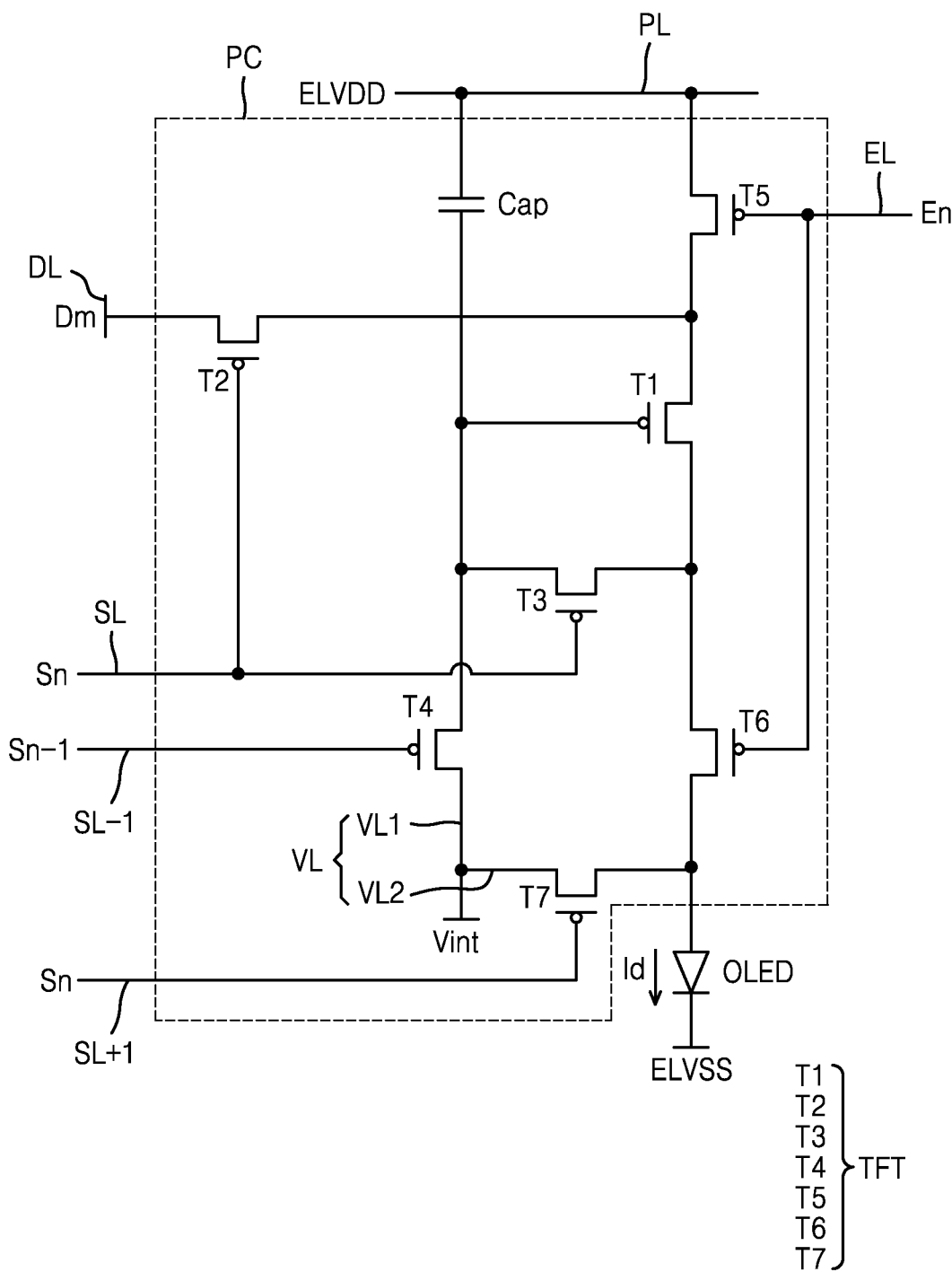
FIG. 5 is an equivalent circuit diagram of a pixel circuit included in a display panel of a display apparatus, according to an embodiment.

FIG. 5 is an equivalent circuit diagram of a pixel circuit PC included in a display panel of a display apparatus, according to an embodiment.

Referring to FIG. 5, the display panel 10 may include a pixel circuit PC including a plurality of thin-film transistors TFT and a storage capacitor Cap. Also, as described above, the display panel 10 may include an organic light-emitting diode OLED that is a display element and emits light by receiving a driving voltage through the pixel circuit PC.

According to an embodiment, the thin-film transistors TFT may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

A gate electrode of the driving thin-film transistor T1 is connected to an electrode of the storage capacitor Cap, one of a source electrode and a drain electrode of the driving thin-film transistor T1 is connected to the driving voltage line PL via the operation control thin-film transistor T5, and the other of the source electrode and the drain electrode of the driving thin-film transistor T1 is electrically connected to a pixel electrode of the organic light-emitting diode OLED via the emission control thin-film transistor T6. The driving thin-film transistor T1 is configured to receive a data signal Dm according to a switching operation of the switching thin-film transistor T2 and supply a driving current Id to the organic light-emitting diode OLED.

A gate electrode of the switching thin-film transistor T2 is connected to the scan line SL, one of a source electrode and a drain electrode of the switching thin-film transistor T2 is connected to the data line DL, and the other of the source electrode and the drain electrode of the switching thin-film transistor T2 is connected to the driving thin-film transistor T1 and to the driving voltage line PL via the operation control thin-film transistor T5. The switching thin-film transistor T2 is turned on in response to a scan signal Sn, which is transmitted via the scan line SL, and is configured to perform a switching operation of transmitting, to the driving thin-film transistor T1, the data signal Dm transmitted to the data line DL.

A gate electrode of the compensation thin-film transistor T3 is connected to the scan line SL, one of a source electrode and a drain electrode of the compensation thin-film transistor T3 is connected to the driving thin-film transistor T1 and the pixel electrode of the organic light-emitting diode OLED via the emission control thin-film transistor T6, and the other of the source electrode and the drain electrode of the compensation thin-film transistor T3 is connected to the electrode of the storage capacitor Cap, the first initialization thin-film transistor T4, and the driving thin-film transistor T1. The compensation thin-film transistor T3 is turned on in response to the scan signal Sn transmitted through the scan line SL and diode-connects the driving thin-film transistor T1 by electrically connecting the gate electrode of the driving thin-film transistor T1 to one (e.g., the drain electrode) of the source electrode and the drain electrode of the driving thin-film transistor T1.

A gate electrode of the first initialization thin-film transistor T4 is connected to a previous scan line SL−1, one of a source electrode and a drain electrode of the first initialization thin-film transistor T4 is connected to a first initialization voltage line VL1 of an initialization voltage line VL, and the other of the source electrode and the drain electrode of the first initialization thin-film transistor T4 is connected to the electrode of the storage capacitor Cap, the compensation thin-film transistor T3, and the driving thin-film transistor T1. The first initialization thin-film transistor T4 is turned on in response to a previous scan signal Sn−1 transmitted through the previous scan line SL−1 and performs an initialization operation of initializing a voltage of the gate electrode of the driving thin-film transistor T1 by transmitting an initialization voltage Vint to the gate electrode of the driving thin-film transistor T1.

A gate electrode of the operation control thin-film transistor T5 is connected to the emission control line EL, one of a source electrode and a drain electrode of the operation control thin-film transistor T5 is connected to the driving voltage line PL, and the other of the source electrode and the drain electrode of the operation control thin-film transistor T5 is connected to the driving thin-film transistor T1 and the switching thin-film transistor T2.

A gate electrode of the emission control thin-film transistor T6 is connected to the emission control line EL, one of a source electrode and a drain electrode of the emission control thin-film transistor T6 is connected to the driving thin-film transistor T1 and a compensation source electrode S3 of the compensation thin-film transistor T3, and the other of the source electrode and the drain electrode of the emission control thin-film transistor T6 is electrically connected to the second initialization thin-film transistor T7 and the pixel electrode of the organic light-emitting diode OLED.

The operation control thin-film transistor T5 and the emission control thin-film transistor T6 are simultaneously turned on in response to an emission control signal En transmitted through the emission control line EL, and a driving voltage ELVDD is transmitted to the organic light-emitting diode OLED. Thus, the driving current Id flows in the organic light-emitting diode OLED.

A gate electrode of the second initialization thin-film transistor T7 may be connected to a next scan line SL+1 of a pixel arranged in a next row of a corresponding pixel PX. Also, one of a source electrode and a drain electrode of the second initialization thin-film transistor T7 is connected to the emission control thin-film transistor T6 and the pixel electrode of the organic light-emitting diode OLED, and the other of the source electrode and the drain electrode of the second initialization thin-film transistor T7 is connected to a second initialization voltage line VL2 of the initialization voltage line VL.

Because the scan line SL and the next scan line SL+1 are electrically connected to each other, the same scan signal Sn may be applied thereto. Therefore, the second initialization thin-film transistor T7 may be turned on in response to a scan signal Sn transmitted through the next scan line SL+1 and may perform an operation of initializing the pixel electrode of the organic light-emitting diode OLED.

As another example, the first initialization thin-film transistor T4 and the second initialization thin-film transistor T7 may be connected together to the previous scan line SL−1.

One electrode of the storage capacitor Cap is connected to the driving voltage line PL, and an opposite electrode of the organic light-emitting diode OLED may receive a common power voltage ELVSS. Accordingly, the organic light-emitting diode OLED may emit light according to the driving current Id transmitted from the driving thin-film transistor T1, and thus an image may be displayed.

FIG. 5 illustrates that the pixel circuit PC includes seven thin-film transistors TFT and one storage capacitor Cap, but one or more embodiments are not limited thereto. The number of thin-film transistors TFT and the number of storage capacitors Cap may be variously changed according to the design of the pixel circuit PC.

Figure 6:
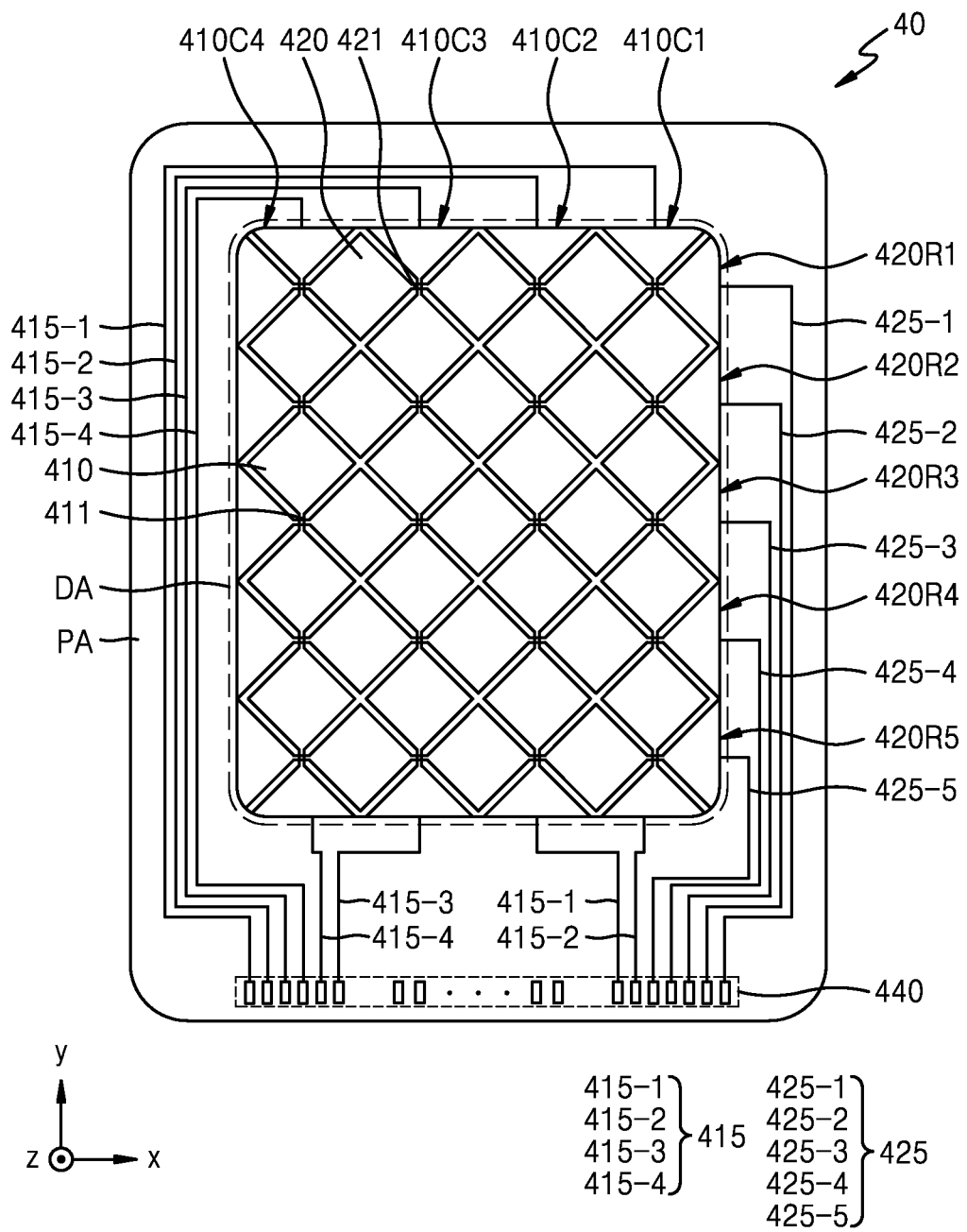
FIG. 6 is a schematic plan view of an input sensing layer of a display apparatus, according to an embodiment.

FIG. 6 is a schematic plan view of an input sensing layer 40 of a display apparatus, according to an embodiment.

Referring to FIG. 6, the input sensing layer 40 may include first sensing electrodes 410, first trace lines 415 connected to the first sensing electrodes 410, second sensing electrodes 420, and second trace lines 425 connected to the second sensing electrodes 420. The first sensing electrodes 410 and the second sensing electrodes 420 may be arranged in a display area DA, and the first trace lines 415-1 to 415-4 and the second trace lines 425-1 to 425-5 may be arranged in a peripheral area PA.

The first sensing electrodes 410 may be arranged in a ±y direction, and the second sensing electrodes 420 may be arranged in a ±x direction intersecting with the ±y direction. The first sensing electrodes 410 arranged in the ±y direction may be connected to each other by first connection electrodes 411 between adjacent first sensing electrodes 410 and may form first sensing lines 410C1, 410C2, 410C3, and 410C4, respectively. The second sensing electrodes 420 arranged in the ±x direction may be connected to each other by second connection electrodes 421 between adjacent second sensing electrodes 420 and may form second sensing lines 420R1, 420R2, 420R3, 420R4, and 420R5, respectively. The first sensing lines 410C1 to 410C4 and the second sensing lines 420R1 to 420R5 may intersect with each other. For example, the first sensing lines 410C1 to 410C4 and the second sensing lines 420R1 to 420R5 may perpendicularly intersect with each other.

The first sensing lines 410C1 to 410C4 may be connected to pads of a sensing signal pad portion 440 through the first trace lines 415-1 to 415-4 formed in the peripheral area PA. For example, the first trace lines 415-1 to 415-4 may have a double routing structure. That is, the first trace lines 415-1 to 415-4 are respectively connected to the upper and lower sides of the first sensing lines 410C1 to 410C4. The first trace lines 415-1 to 415-4 respectively connected to the upper and lower sides of the first sensing lines 410C1 to 410C4 may be connected to corresponding pads.

The second sensing lines 420R1 to 420R5 may be connected to the pads of the sensing signal pad portion 440 through the second trace lines 425-1 to 425-5 formed in the peripheral area PA. For example, the second trace lines 425-1 to 425-5 may be connected to corresponding pads.

FIG. 6 illustrates the double routing structure in which the first trace lines 415-1 to 415-4 are respectively connected to the upper and lower sides of the first sensing lines 410C1 to 410C4, and such a structure may improve sensing sensitivity (or touch sensitivity). However, one or more embodiments are not limited thereto. In another embodiment, the first trace lines 415-1 to 415-4 may have a single routing structure. That is, the first trace lines 415-1 to 415-4 may be respectively connected to the upper or lower side of the first sensing lines 410C1 to 410C4.

Also, FIG. 6 illustrates four first trace lines 415-1 to 415-4 and five second trace lines 425-1 to 425-5, but this is only an example, and one or more embodiments are not limited thereto.

Figure 7:
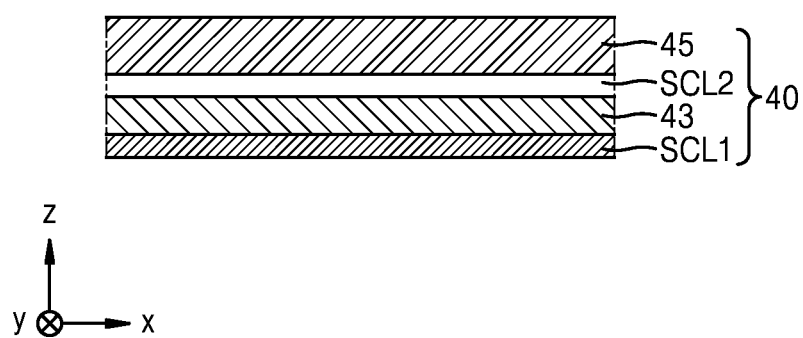
FIG. 7 is a cross-sectional view illustrating a stacked structure of an input sensing layer, according to an embodiment.

FIG. 7 is a cross-sectional view illustrating a stacked structure of an input sensing layer 40, according to an embodiment.

Referring to FIG. 7, the input sensing layer 40 may include a first sensing conductive layer SCL1 and a second sensing conductive layer SCL2. A first insulating layer 43 may be between the first sensing conductive layer SCL1 and the second sensing conductive layer SCL2, and a second insulating layer 45 may be located on the second sensing conductive layer SCL2.

The first and second sensing conductive layers SCL1 and SCL2 may include a metal layer or a transparent conductive layer. The metal layer may include molybdenum (Mo), mendelevium (Mb), silver (Ag), titanium (Ti), copper (Cu), aluminum (Al), and any alloy thereof. The transparent conductive layer may include a transparent conductive oxide such as indium tin oxide (ITO), indium zinc oxide (IZO), zinc oxide (ZnO), and indium tin zinc oxide (ITZO). In addition, the transparent conductive layer may include a conductive polymer such as poly(3,4-ethylenedioxythiophene) (PEDOT), metal nanowires, or graphene.

The first and second sensing conductive layers SCL1 and SCL2 may be single-layered or multilayered. The single-layered first and second sensing conductive layers SCL1 and SCL2 may include a metal layer or a transparent conductive layer, and materials of the metal layer and the transparent conductive layer are the same as described above. One of the first and second sensing conductive layers SCL1 and SCL2 may include a single-layered metal layer. The single-layered metal layer may include a Mo layer or an alloy layer of Mo and Mb. One of the first and second sensing conductive layers SCL1 and SCL2 may include a multilayered metal layer. The multilayered metal layer may include, for example, three layers of a Ti layer/Al layer/Ti layer, or may include two layers of a Mo layer/Mb layer. Alternatively, the multilayered metal layer may include a metal layer and a transparent conductive layer. The first and second sensing conductive layers SCL1 and SCL2 may have different stacked structures or may have the same stacked structure. For example, the first sensing conductive layer SCL1 may include a metal layer, and the second sensing conductive layer SCL2 may include a transparent conductive layer. Alternatively, the first and second sensing conductive layers SCL1 and SCL2 may include the same metal layer.

The materials of the first and second sensing conductive layers SCL1 and SCL2 and the arrangement of the sensing electrodes provided in the first and second sensing conductive layers SCL1 and SCL2 may be determined considering sensing sensitivity. An RC delay may influence the sensing sensitivity. Because the sensing electrodes including the metal layers have a low resistance compared with the transparent conductive layers, an RC value may be reduced. Therefore, the charging time of a capacitor defined between the sensing electrodes may be reduced. The sensing electrodes including the transparent conductive layers are not visible to a user compared with the metal layers, and the input area may increase, thereby increasing the capacitance.

Each of the first and second insulating layers 43 and 45 may include an inorganic insulating material or/and an organic insulating material. The inorganic insulating material may include silicon oxide, silicon nitride, or silicon oxynitride, and the organic insulating material may include a polymer organic material.

Each of the first sensing electrodes 410 (see FIG. 6), the first connection electrodes 411 (se FIG. 7), the second sensing electrodes 420 (see FIG. 7), and the second connection electrodes 421 (see FIG. 7) may be included in one of the first sensing conductive layer SCL1 and the second sensing conductive layer SCL2. That is, some of the first and second sensing electrodes 410 and 420 and the first and second connection electrodes 411 and 421 are located on the first sensing conductive layer SCL1, and the others thereof may be located on the second sensing conductive layer SCL2.

In an embodiment, the first sensing conductive layer SCL1 may include the first connection electrodes 411, and the second sensing conductive layer SCL2 may include the first and second sensing electrodes 410 and 420 and the second connection electrodes 421. In another embodiment, the first sensing conductive layer SCL1 may include the first and second sensing electrodes 410 and 420 and the second connection electrodes 421, and the second sensing conductive layer SCL2 may include the first connection electrodes 411. In another embodiment, the first sensing conductive layer SCL1 may include the first sensing electrodes 410 and the first connection electrodes 411, and the second sensing conductive layer SCL2 may include the second sensing electrodes 420 and the second connection electrodes 421. In this case, the first sensing electrodes 410 and the first connection electrodes 411 are provided on the same layer and connected as one body, and the second sensing electrodes 420 and the second connection electrodes 421 are also provided on the same layer. Therefore, no contact holes may be provided in the insulating layer between the first sensing conductive layer SCL1 and the second sensing conductive layer SCL2.

FIG. 7 illustrates that the input sensing layer 40 includes the first sensing conductive layer SCL1, the first insulating layer 43, the second sensing conductive layer SCL2, and the second insulating layer 45, but in another embodiment, a layer including an inorganic insulating material or an organic insulating material may be further arranged below the first sensing conductive layer SCL1.

Figure 8A:
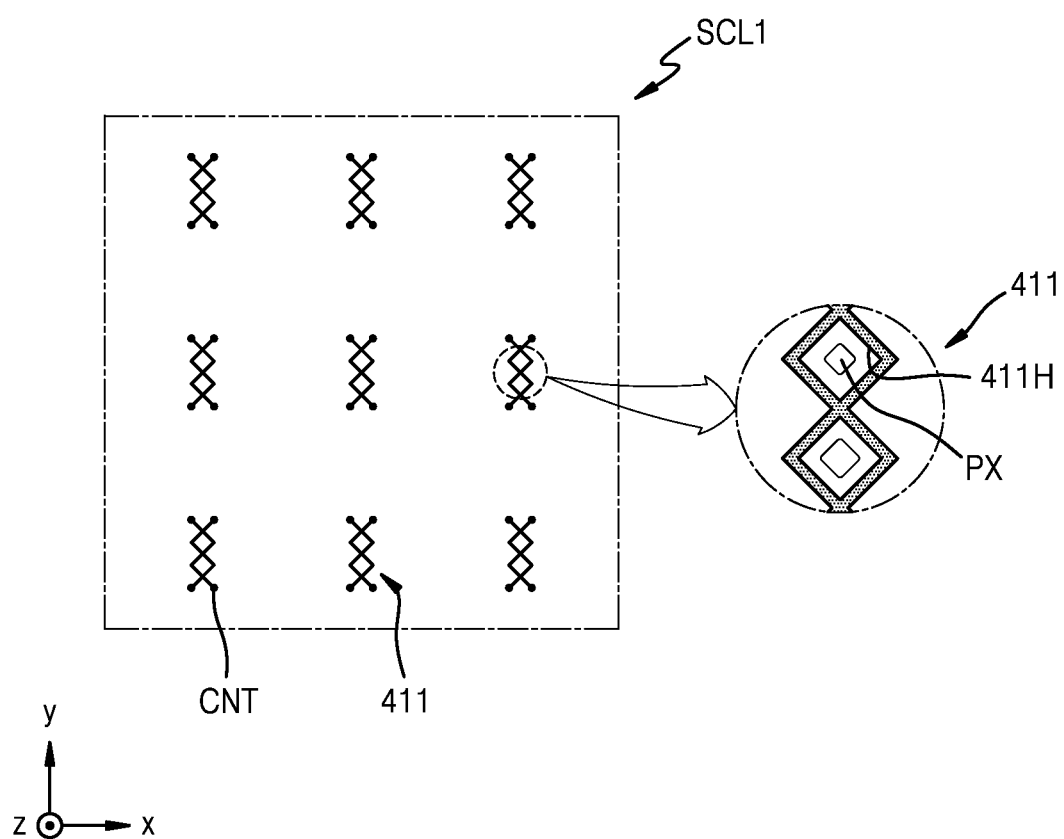
FIGS. 8A and 8B are respectively plan views of a first sensing conductive layer and a second sensing conductive layer of an input sensing layer, according to an embodiment.
Figure 8B:
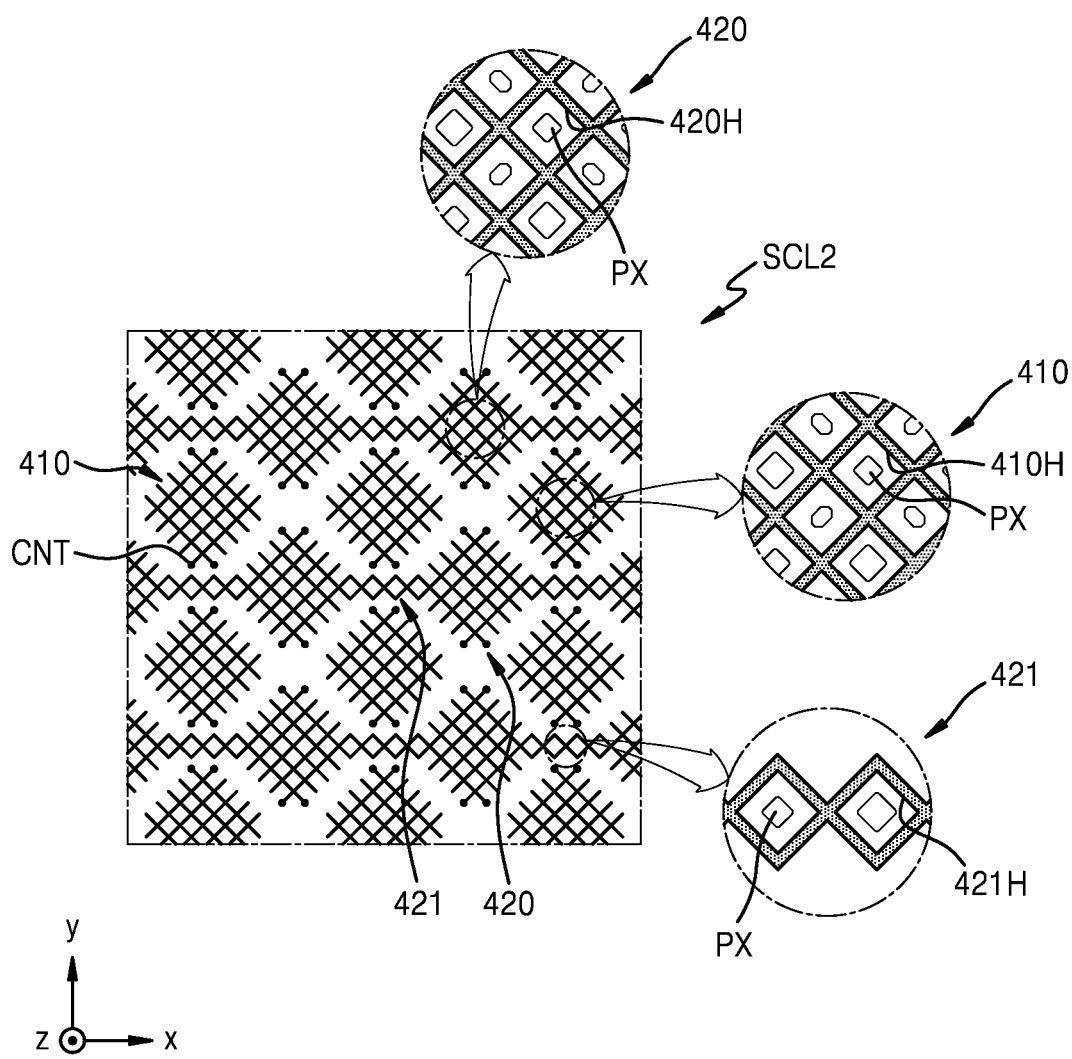

FIGS. 8A and 8B are respectively plan views of a first sensing conductive layer SCL1 and a second sensing conductive layer SCL2 of an input sensing layer, according to an embodiment.

Referring to FIGS. 8A and 8B, the first and second sensing electrodes 410 and 420 and the first and second connection electrodes 411 and 421 may have a mesh (or grid) shape. When the first and second sensing electrodes 410 and 420 include a metal layer, the first and second sensing electrodes 410 and 420 may have a mesh shape as illustrated in FIGS. 8A and 8B so as to prevent the first and second sensing electrodes 410 and 420 from being visible to the user and/or to transmit light emitted from each pixel PX.

As illustrated in the enlarged views of FIGS. 8A and 8B, the first and second sensing electrodes 410 and 420 may include mesh-shaped metal layers including holes 410H and 420H, respectively. Similarly, the first and second connection electrodes 411 and 421 may also include mesh-shaped metal layers including holes 411H and 421H, respectively. The holes 410H, 420H, 411H, and 421H may be arranged to overlap the pixels PX.

As illustrated in FIG. 8A, the first sensing conductive layer SCL1 may include the first connection electrodes 411. The first connection electrodes 411 may electrically connect the first sensing electrodes 410 to each other, the first sensing electrodes 410 being formed on a different layer from the first connection electrodes 411. The first connection electrodes 411 electrically connecting adjacent first sensing electrodes 410 to each other may be connected to the first sensing electrodes 410 through a contact hole formed in the first insulating layer 43 (see FIG. 7).

As illustrated in FIG. 8B, the second sensing conductive layer SCL2 may include the first sensing electrodes 410, the second sensing electrodes 420, and the second connection electrodes 421. The second sensing electrodes 420 may be connected to each other by the second connection electrodes 421 formed on the same layer as the second sensing electrodes 420. For example, the second sensing electrodes 420 and the second connection electrodes 421 may include the same material and may be formed as one body. The first sensing electrodes 410 may be electrically connected to each other by the first connection electrodes 411 formed on a different layer from the first sensing electrodes 410. The first sensing electrodes 410 may be connected to the first sensing electrodes 410 through the contact hole formed in the first insulating layer 43.

Figure 9:
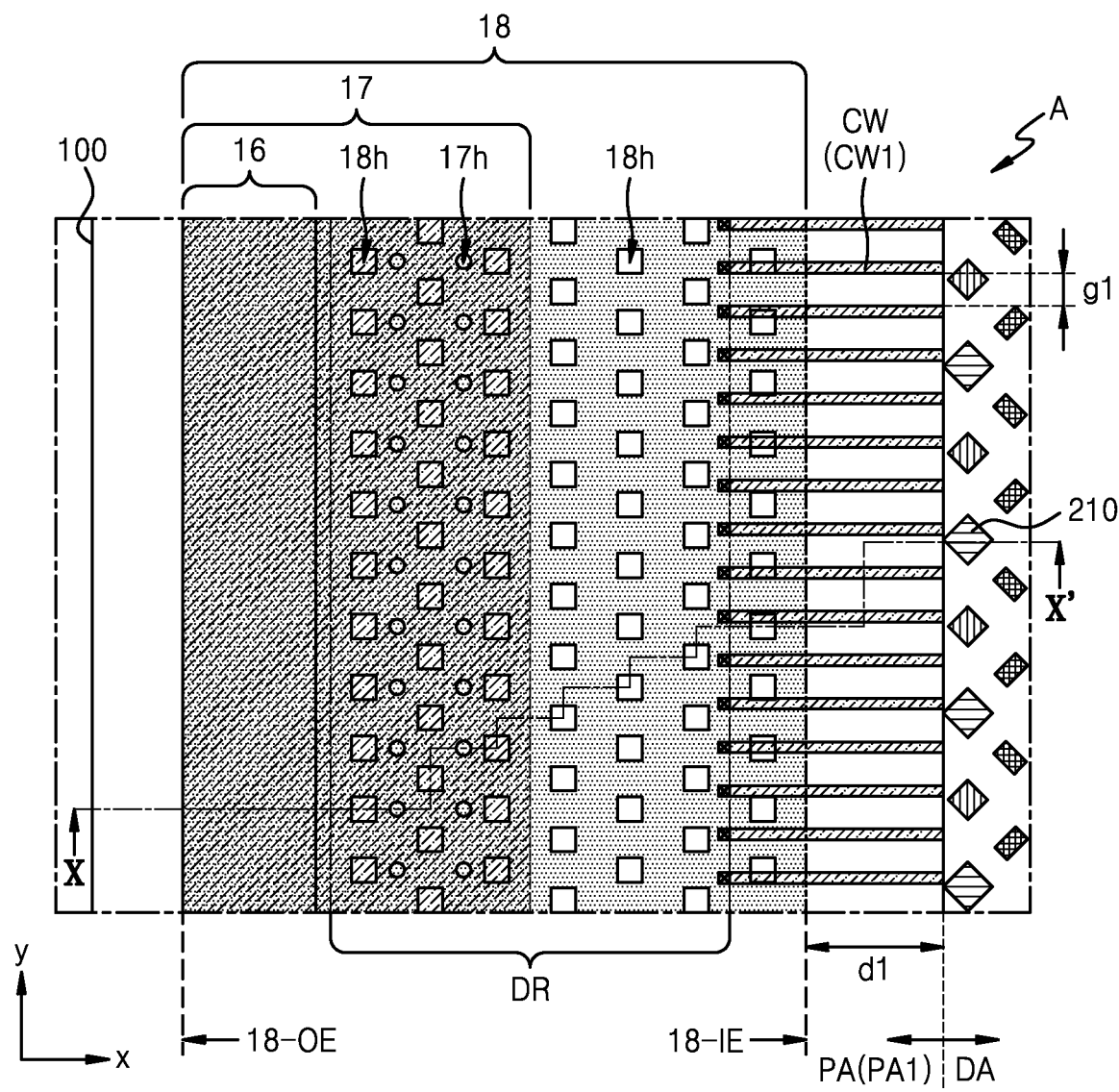
FIG. 9 is a schematic enlarged plan view of an arrangement of some elements of a display apparatus, according to an embodiment.

FIG. 9 is a schematic enlarged view of an arrangement of some elements of a display apparatus, according to an embodiment, and may correspond to an area A of the display panel in FIG. 4. The area A in FIG. 4 may include a portion of the display area DA and a portion of the first peripheral area PA1 of the peripheral area PA in the display apparatus 1.

First, referring to the display area DA of the FIG. 9, pixel electrodes 210 of the organic light-emitting diodes OLED (see FIG. 5) may be arranged in the display area DA. The plurality of pixel electrodes 210 may be arranged to be spaced apart from each other. FIG. 9 illustrates that the pixel electrodes 210 are arranged in a PENTILE® matrix, but one or more embodiments are not limited thereto. The pixel electrodes 210 may be arranged in, for example, a real stripe type, an s-stripe type, or a diamond type. Though not illustrated in FIG. 9, an intermediate layer (not shown) and an opposite electrode (not shown) may be arranged on each of the pixel electrodes 210.

Referring to the peripheral area PA of FIG. 9, a common power supply wire 16, a power supply conductive layer 17, and a power supply electrode layer 18 may be arranged in the peripheral area PA. The common power supply wire 16, the power supply conductive layer 17, and the power supply electrode layer 18 may be arranged so that at least a portion of each of the common power supply wire 16, the power supply conductive layer 17, and the power supply electrode layer 18 overlaps each other on a plane. In this case, "on a plane" means "when viewed in a direction perpendicular to one surface (e.g., an upper surface) of the substrate 100." In an embodiment, a width of the common power supply wire 16 may be less than a width of the power supply conductive layer 17, and the width of the power supply conductive layer 17 may be less than a width of the power supply electrode layer 18. However, one or more embodiments are not limited thereto.

In an embodiment, in a portion of an area in which the common power supply wire 16 and the power supply conductive layer 17 overlap each other, the common power supply wire 16 may be in direct contact with the power supply conductive layer 17. Similarly, in a portion of an area in which the power supply conductive layer 17 and the power supply electrode layer 18 overlap each other, the power supply conductive layer 17 may be in direct contact with the power supply electrode layer 18. Consequently, the common power supply wire 16 may be electrically connected to the power supply electrode layer 18 through the power supply conductive layer 17. The common power supply wire 16 may provide the common power voltage ELVSS (see FIG. 5) to the opposite electrode of the organic light-emitting diode OLED through the power supply conductive layer 17 and the power supply electrode layer 18. That is, the power supply conductive layer 17 and the power supply electrode layer 18 may function to receive the common power voltage ELVSS from the common power supply wire 16 and transmit the same to the opposite electrode.

The power supply conductive layer 17 may include a plurality of first holes 17h, and the power supply electrode layer 18 may include a plurality of second holes 18h. FIG. 9 illustrates that each of the first holes 17h has a circular shape on a plane and each of the second holes 18h has a square shape on a plane, but one or more embodiments are not limited thereto. A size (e.g., width) and shape of each of the first holes 17h and the second holes 18h maybe variously modified.

The first holes 17h may provide a path for discharging gas contained in an organic insulating layer under the power supply conductive layer 17, and similarly, the second holes 18h may provide a path for discharging gas contained in an organic insulating layer below the power supply electrode layer 18.

When certain heat is applied to the organic insulating layers in a manufacturing process of the display apparatus 1, materials contained in the organic insulating layers may be vaporized. As a comparative example, when the first holes 17h and the second holes 18h are not provided, gas generated in the organic insulating layers may not be discharged by the power supply conductive layer 17 and/or the power supply electrode layer 18 and may flow toward the display area DA. Such the gas may influence some of the organic light-emitting diodes OLED arranged at an edge of the display area DA and thus cause a problem in which light is not emitted from some of the organic light-emitting diodes OLED. According to an embodiment, in order to prevent such the problem, the power supply conductive layer 17 and the power supply electrode layer 18 respectively include the first holes 17h and the second holes 18h, and may discharge gas in the organic insulating layers to the outside through the first holes 17h and the second holes 18h.

In an embodiment, the power supply electrode layer 18 may be arranged to be spaced apart from the display area DA by a certain distance d1 on a plane. In other words, the power supply electrode layer 18 may include an inner edge 18-IE facing the display area DA on a plane and an outer edge 18-OE opposite the inner edge 18-IE. The inner edge 18-IE of the power supply electrode layer 18 may be spaced apart from the display area DA by the distance d1. This is to more effectively prevent gas that needs to be discharged from flowing to the display area DA. In this case, a boundary of the display area DA providing a reference for the distance d1 may be defined by a virtual line connecting edges of the outermost pixel electrodes 210 among the pixel electrodes 210 arranged in the display area DA.

A driving circuit portion DR may be arranged in the peripheral area PA. For example, the driving circuit portion DC may include the aforedescribed first scan driving circuit 11 and emission control driving circuit 13 (see FIG. 4). The driving circuit portion DR may overlap at least a portion of each of the power supply conductive layer 17 and the power supply electrode layer 18. Also, a plurality of connection wires CW may be arranged in the peripheral area PA. The connection wires CW may electrically connect the driving circuit portion DR and the pixel circuits PC (see FIG. 4) located in the display area DA to each other. Accordingly, the driving circuit portion DR may provide an electrical signal (e.g., a scan signal and/or an emission control signal) to the pixel circuits PC through the connection wires CW.

The connection wires CW extend from the driving circuit portion DR toward the display area DA, but may entirely extend in a straight line or may at least partially be bent according to a formation location thereof. For example, as illustrated in FIG. 9, the connection wires CW may include a plurality of first connection wires CW1 extending in a straight line from the driving circuit portion DR toward the display area DA. The first connection wires CW1 may be located, for example, in the first peripheral area PA1. The first connection wires CW1 may also be located in the second to fourth peripheral areas PA2, PA3, and PA4 (see FIG. 3A). The first connection wires CW1 may be able to transmit different electrical signals, and may be arranged to be spaced apart from each other by a certain gap (i.e., a first gap g1). Also, gas generated in an organic insulating layer located below the first connection wires CW1 may be discharged to the outside through a space between the first connection wires CW1.

Figure 10:
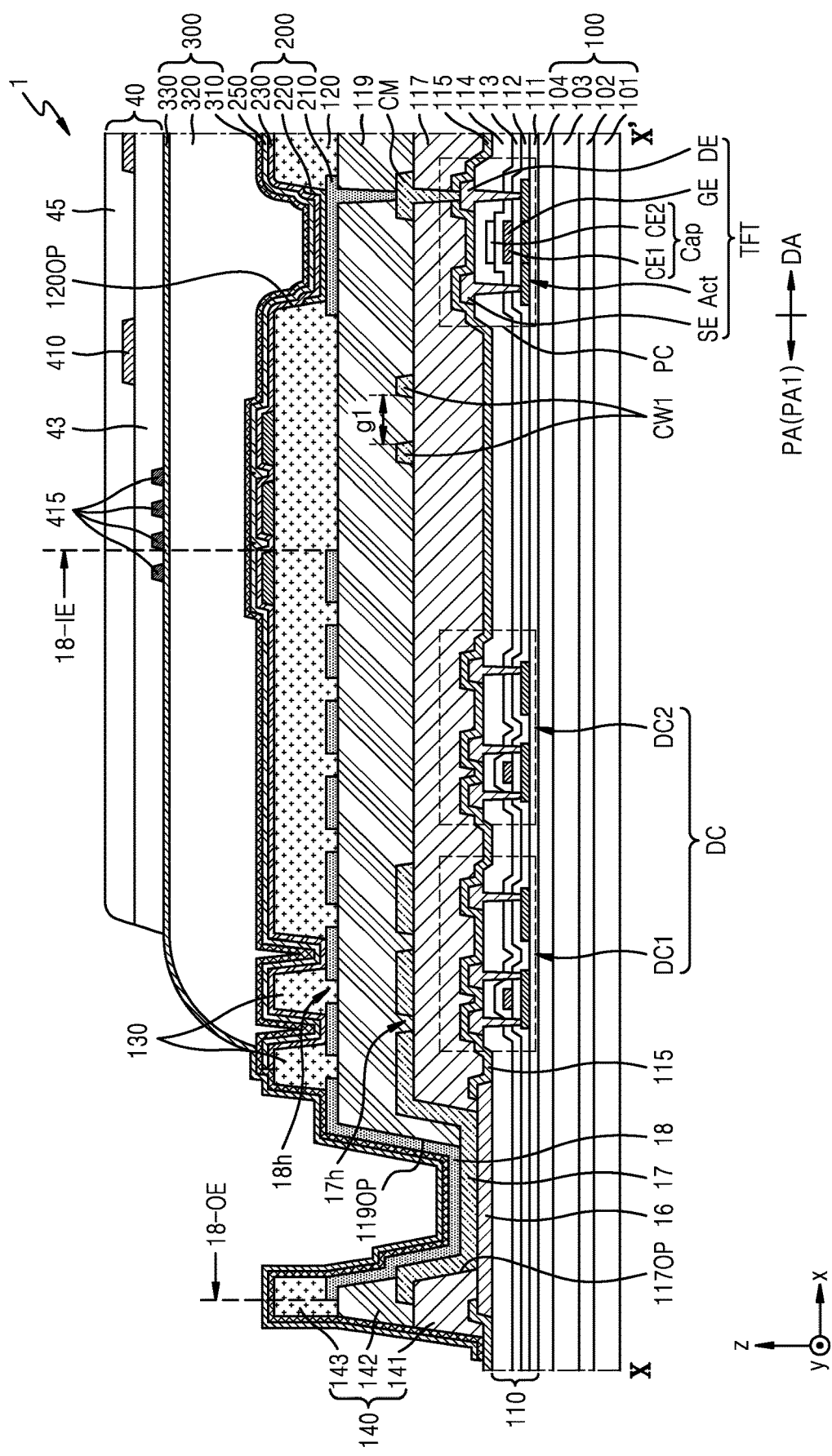
FIG. 10 is a schematic cross-sectional view of a portion of a display apparatus, according to an embodiment.

FIG. 10 is a schematic cross-sectional view of a portion of a display apparatus 1, according to an embodiment, and is a cross-sectional view of the display apparatus taken along a line X-X' of FIG. 9.

Referring to FIG. 10, the display apparatus 1 may include the substrate 100. The substrate 100 may include glass or a polymer resin. The substrate 100 including the polymer resin may be a flexible substrate that is bendable, foldable, or rollable. In an embodiment, the substrate 100 may have a multilayered structure including a base layer including a polymer resin and a barrier layer including an inorganic insulating material. For example, the substrate 100 may include a first base layer 101, a first barrier layer 102, a second base layer 103, and a second barrier layer 104, which are sequentially stacked. The first base layer 101 and the second base layer 103 may include, for example, polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The first barrier layer 102 and the second barrier layer 104 may include, for example, silicon oxide, silicon oxynitride, and/or silicon nitride.

A buffer layer 111 may be located on the substrate 100, may reduce or prevent penetration of a foreign material, moisture, or external air from the bottom of the substrate 100 and may planarize the substrate 100. The buffer layer 111 may include an inorganic material such as oxide or nitride, an organic material, or a combination of an organic material and an inorganic material, and may have a single-layered or multilayered structure including an inorganic material and an organic material. A barrier layer (not shown) may be further provided between the substrate 100 and the buffer layer 111 to prevent penetration of external air.

Referring to the display area DA in FIG. 10, a pixel circuit PC may be arranged on the buffer layer 111. The pixel circuit PC may include thin-film transistors TFT and the storage capacitor Cap. For convenience of illustration, FIG. 10 illustrates only one thin-film transistor TFT.

The thin-film transistor TFT may include a semiconductor layer Act, a gate electrode GE overlapping a channel region of the semiconductor layer Act, and a source electrode SE and drain electrode DE respectively connected to a source region and drain region of the semiconductor layer Act. The source region and the drain region of the semiconductor layer Act may be arranged on both sides with the channel region of the semiconductor layer Act therebetween.

In an embodiment, the semiconductor layer Act may include polysilicon. In some embodiments, the semiconductor layer Act may include amorphous silicon. In some embodiments, the semiconductor layer Act may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), Ti, and zinc (Zn). The semiconductor layer Act may include the channel region, and the source region and drain region where impurities are doped.

The gate electrode GE may include a low-resistance conductive material such as Mo, Al, Cu, and/or Ti, and may have a single-layered or multilayered structure including the aforedescribed material.

The source electrode SE or drain electrode DE may include Al, platinum (Pt), palladium (Pd), Ag, magnesium (Mg), gold (Au), nickel (Ni), neodymium (Nd), iridium (Ir), Cr, calcium (Ca), Mo, Ti, tungsten (W), and/or Cu, and may have a single-layered or multilayered structure including the aforedescribed material. For example, the source electrode SE or drain electrode DE may have a three-layered structure of Ti layer/Al layer/Ti layer. The source electrode SE or the drain electrode DE may be arranged on the same layer.

In order to secure insulation between the semiconductor layer Act and the gate electrode GE, a first gate insulating layer 112 may be between the semiconductor layer Act and the gate electrode GE. The first gate insulating layer 112 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), and may have a single-layered or multilayered structure including the aforedescribed material.

A second gate insulating layer 113 may cover the gate electrode GE. The second gate insulating layer 113 may include an inorganic insulating material, such as $SiO_2$, $SiN_x$, SiON, $Al_2O_3$, $TiO_2$, $Ta_2O_5$, $HfO_2$, or $ZnO_2$, and may have a single-layered or multilayered structure including the aforedescribed material.

In an embodiment, a first electrode CE1 of the storage capacitor Cap may overlap the thin-film transistor TFT. In this regard, the thin-film transistor TFT may be the driving thin-film transistor T1 (see FIG. 5). The gate electrode GE of the thin-film transistor TFT may function as the first electrode CE1 of the storage capacitor Cap.

A second electrode CE2 of the storage capacitor Cap may be arranged to overlap the first electrode CE1 with the second gate insulating layer 113 therebetween. In this case, the second gate insulating layer 113 may function as a dielectric layer of the storage capacitor Cap. The second electrode CE2 may include a conductive material, such as Al, Pt, Pd, Ag, Mg, Au, Ni, Nd, Ir, Cr, Ca, Mo, Ti, W, or Cu, and may have a single-layered or multilayered structure including the aforedescribed material. As an example, the second electrode CE2 may have a single-layered structure of Mo or a multilayered structure of Mo/Al/Mo.

An interlayer insulating layer 114 may cover the second electrode CE2 of the storage capacitor Cap. The interlayer insulating layer 114 may include an inorganic insulating material, such as $SiO_2$, $SiN_x$, SiON, $Al_2O_3$, $TiO_2$, $Ta_2O_5$, $HfO_2$, or $ZnO_2$, and may have a single-layered or multilayered structure including the aforedescribed material.

A first organic insulating layer 117 may be arranged on the interlayer insulating layer 114. The first organic insulating layer 117 includes an organic insulating material, and the organic insulating material may include an imide-based polymer, a general-purpose polymer such as polymethylmethacrylate (PMMA) or polystyrene (PS), polymer derivatives having a phenol-based group, an acrylic polymer, an aryl ether-based polymer, an amide-based polymer, a fluorine-based polymer, a p-xylene-based polymer, a vinyl alcohol-based polymer, or a blend thereof. In an embodiment, the first organic insulating layer 117 may include polyimide.

A second organic insulating layer 119 may be arranged on the first organic insulating layer 117. The second organic insulating layer 119 may include an imide-based polymer, a general-purpose polymer such as PMMA or PS, polymer derivatives having a phenol-based group, an acrylic polymer, an aryl ether-based polymer, an amide-based polymer, a fluorine-based polymer, a p-xylene-based polymer, a vinyl alcohol-based polymer, or a blend thereof. In an embodiment, the second organic insulating layer 119 may include polyimide.

A pixel electrode 210 may be arranged on the second organic insulating layer 119. The pixel electrode 210 may include a light transmissive conductive layer and a reflective layer, the light transmissive conductive layer including a light transmissive conductive oxide such as ITO, indium oxide ($In_2O_3$), or IZO, and the reflective layer including metal such as Al or Ag. For example, the pixel electrode 210 may have a three-layered structure of ITO/Ag/ITO. The pixel electrode 210 may be connected to a contact metal CM through a contact hole formed in the second organic insulating layer 119, and the contact metal CM may be electrically connected to the thin-film transistor TFT in contact with any one of the source electrode SE and the drain electrode DE through a contact hole formed in the first organic insulating layer 117. That is, the pixel electrode 210 may be electrically connected to the pixel circuit PC through the contact metal CM.

A pixel-defining layer 120 may be arranged on the pixel electrode 210 and may include an opening corresponding to each pixel, that is, an opening 120OP through which at least a central portion of the pixel electrode 210 is exposed, thereby defining an emission area of the pixel. Also, the pixel-defining layer 120 may increase a distance between an edge of the pixel electrode 210 and an opposite electrode 230, thereby preventing an arc or the like from occurring therebetween. The pixel-defining layer 120 may include, for example, an organic material such as polyimide or hexamethyldisiloxane (HMDSO).

An intermediate layer 220 may be arranged on the pixel-defining layer 120. The intermediate layer 220 may be arranged between the pixel electrode 210 and the opposite electrode 230.

The intermediate layer 220 may include an emission layer formed to correspond to the pixel electrode 210. The emission layer may include an organic light-emitting material such as a polymer organic material or a low-molecular weight organic material emitting light having a certain color. Alternatively, the emission layer may include an inorganic light-emitting material or quantum dots.

In an optional embodiment, functional layers, such as a hole transport layer (HTL), a hole injection layer (HIL), an electron transport layer (ETL), and an electron injection layer (EIL), may be further arranged below and on the emission layer. For example, among the functional layers, a first functional layer is an HTL having a single-layered structure and may include poly-(3,4)-ethylene-dihydroxy thiophene (PEDOT) or polyaniline (PANI). Alternatively, the first functional layer may include an HIL and an HTL. Among the functional layers, a second functional layer may include an ETL and/or an EIL.

Though FIG. 10 illustrates that the intermediate layer 220 is formed to correspond to one pixel electrode 210 as an example, one or more embodiments are not limited thereto. As another example, the intermediate layer 220 may include an integrated layer over the pixel electrodes 210. Various other modifications may be made.

The opposite electrode 230 may be arranged on the intermediate layer 220 to cover the display area DA. That is, the opposite electrode 230 may be formed as one body to cover the pixel electrodes 210. The opposite electrode 230 may extend from the display area DA to the peripheral area PA. The opposite electrode 230 may include a conductive material having a low work function. For example, the opposite electrode 230 may include a (semi-)transparent layer including Ag, Mg, Al, Pt, Pd, Au, Ni, Nd, Ir, Cr, Li, Ca, or an alloy thereof. Alternatively, the opposite electrode 230 may further include a layer on the (semi-)transparent layer including the aforedescribed material, the layer including ITO, IZO, ZnO, or $In_2O_3$.

A stacked structure of the pixel electrode 210, the intermediate layer 220, and the opposite electrode 230 may form an organic light-emitting diode OLED as a display element 200. An emission area of each organic light-emitting diode OLED may be defined by the pixel PX (see FIG. 4). Because the opening 120OP of the pixel-defining layer 120 defines a size and/or width of the emission area, a size and/or width of the pixel PX may be dependent on the size and/or width of the corresponding opening 120OP of the pixel-defining layer 120.

A capping layer 250 may be provided on the opposite electrode 230. The capping layer 250 may include an organic insulating layer and/or an inorganic insulating material such as silicon nitride. In some embodiments, the capping layer 250 may be omitted. The capping layer 250 may cover the display area DA and extend from the display area DA to the peripheral area PA.

An encapsulation layer 300 covers a plurality of display elements 200 and may prevent damage by moisture or oxygen from the outside. The encapsulation layer 300 may cover the display area DA and extend from the display area DA to the peripheral area PA. Such the encapsulation layer 300 may include at least one inorganic encapsulation layer and at least one organic encapsulation layer. FIG. 10 illustrates that the encapsulation layer 300 includes a first inorganic encapsulation layer 310, an organic encapsulation layer 320, and a second inorganic encapsulation layer 330 as an example.

The first inorganic encapsulation layer 310 covers the opposite electrode 230 and may include silicon oxide, silicon nitride, and/or silicon oxynitride. Because the first inorganic encapsulation layer 310 is formed along a structure therebelow, an upper surface of the first inorganic encapsulation layer 310 may not be flat. The organic encapsulation layer 320 may cover the first inorganic encapsulation layer 310. Unlike the first inorganic encapsulation layer 310, an upper surface of the organic encapsulation layer 320 may be substantially flat. In detail, the upper surface of the organic encapsulation layer 320 may be substantially flat in a portion thereof corresponding to the display area DA. The organic encapsulation layer 320 may include a polymer-based material. The polymer-based material may include an acrylic resin, an epoxy-based resin, polyimide, polyethylene, and the like. The acrylic resin may include, for example, polymethyl methacrylate, polyacrylic acid, and the like. The organic encapsulation layer 320 may be transparent. The second inorganic encapsulation layer 330 covers the organic encapsulation layer 320 and may include silicon oxide, silicon nitride, and/or silicon oxynitride.

The first and second inorganic encapsulation layers 310 and 330 may be formed by chemical vapor deposition (CVD), and the organic encapsulation layer 320 may be formed through a process of applying a liquid organic material on the substrate 100 and then curing the liquid organic material.

In an embodiment, the input sensing layer 40 may be directly arranged on the encapsulation layer 300. FIG. 10 illustrates a cross-section of a stacked structure of the first insulating layer 43 of the input sensing layer 40, the first trace lines 415 (see FIG. 6) among the trace lines as a portion of the first sensing conductive layer SCL1, the second insulating layer 45 on the first insulating layer 43, and the first sensing electrodes 410 as a portion of the second sensing conductive layer SCL2. The first sensing electrodes 410 may be located in the display area DA. In some embodiments, a portion of the first sensing electrodes 410 arranged on the outermost side of the display area DA may be located in the peripheral area PA. The first trace lines 415 may be arranged in the peripheral area PA. The first insulating layer 43 and the second insulating layer 45 may extend from the display area DA to the peripheral area PA.

Referring to the peripheral area PA in FIG. 10, an inorganic insulating layer 110 is arranged on the substrate 100, and the inorganic insulating layer 110 may include the aforedescribed buffer layer 111, first gate insulating layer 112, second gate insulating layer 113, and interlayer insulating layer 114. The common power supply wire 16 may be arranged on the inorganic insulating layer 110. The common power supply wire 16 and the source electrode SE and/or the drain electrode DE may include the same material.

A portion of an upper surface of the common power supply wire 16 may be exposed by a first opening 117OP of the first organic insulating layer 117 arranged on the common power supply wire 16. The upper surface of the common power supply wire 16 exposed through the first opening 117OP may be partially in direct contact with the power supply conductive layer 17 arranged on the first organic insulating layer 117. That is, in the peripheral area PA, the power supply conductive layer 17 may be in direct contact with the common power supply wire 16 through the first opening 117OP of the first organic insulating layer 117.

An edge or side of the common power supply wire 16 may be covered with a protective layer 115. The protective layer 115 may prevent the common power supply wire 16 including metal, such as aluminum, that may be damaged by an etchant from being exposed to an etching environment in a manufacturing process of the display apparatus 1. In the peripheral area PA other than the area shown in FIG. 10, the common power supply wire 16 may be exposed without being covered with the first organic insulating layer 117, and the exposed common power supply wire 16 may be damaged from the side by an etchant used in a process after the common power supply wire 16 is formed. To prevent this, the protective layer 115 may cover and protect the side of the common power supply wire 16.

The protective layer 115 may cover the thin-film transistor TFT in the display area DA. The protective layer 115 may include, for example, silicon nitride ($SiN_x$). Hydrogen contained in the silicon nitride is combined with dangling bonds of semiconductor layers of thin-film transistors and removes defect sites in the semiconductor layers, thereby improving characteristics of the thin-film transistors.

The power supply conductive layer 17 is arranged on the first organic insulating layer 117 and may be in direct contact with the upper surface of the common power supply wire 16 through the first opening 117OP. The power supply conductive layer 17 may include a conductive material including Ag, Mg, Al, Pt, Pd, Au, Ni, Nd, Ir, Cr, Li, Ca, or an alloy thereof.

The power supply conductive layer 17 may have a greater width than a width of the common power supply wire 16. The greater width of the power supply conductive layer 17 may reduce the electrical resistance of the power supply conductive layer 17 and may minimize a voltage drop of a common power voltage ELVSS transmitted by the power supply conductive layer 17.

The power supply conductive layer 17 may include the plurality of first holes 17h. For example, a portion of the power supply conductive layer 17 overlapping the first organic insulating layer 117 may include the first holes 17h, and a portion of the power supply conductive layer 17 in direct contact with the common power supply wire 16 may not include the first holes 17h to increase a contact area.

The power supply conductive layer 17 is partially covered with the second organic insulating layer 119, and a portion of an upper surface of the power supply conductive layer 17 may be exposed through a second opening 119OP of the second organic insulating layer 119. The exposed upper surface of the power supply conductive layer 17 may be in contact with and electrically connected to the power supply electrode layer 18.

The power supply electrode layer 18 is arranged on the second organic insulating layer 119 and may be in direct contact with the power supply conductive layer 17 through the second opening 119OP. The power supply electrode layer 18 and the pixel electrode 210 may include the same material. For example, the power supply electrode layer 18 may include a three-layered structure of ITO/Ag/ITO.

The power supply electrode layer 18 may have a greater width than a width of the power supply conductive layer 17. The greater width of the power supply electrode layer 18 may reduce the electrical resistance of the power supply electrode layer 18 and may minimize a voltage drop of a common power voltage ELVSS transmitted by the power supply electrode layer 18.

The power supply electrode layer 18 may include the plurality of second holes 18h. For example, a portion of the power supply electrode layer 18 overlapping the second organic insulating layer 119 may include the second holes 18h, and a portion of the power supply electrode layer 18 in direct contact with the power supply conductive layer 17 may not include the second holes 18h to increase a contact area.

As described above, the first holes 17h of the power supply conductive layer 17 and the second holes 18h of the power supply electrode layer 18 may each provide a path through which materials contained in insulating layers (i.e., the first organic insulating layer and the second organic insulating layer) below the power supply conductive layer 17 and the power supply electrode layer 18 are vaporized and discharged to the outside. After the pixel-defining layer 120 is formed on the pixel electrode 210, a thermal process (e.g., a curing process) is performed. A portion of materials contained in the second organic insulating layer 119 or the first organic insulating layer 117 below the power supply electrode layer 18 may be vaporized and then discharged to the outside through the first holes 17h and/or the second holes 18h. Therefore, when the first holes 17h and the second holes 18h are not provided, gas generated in the organic insulating layers flows toward the display elements 200 and influences display elements 200 of some pixels arranged at an edge of the display area DA, thereby producing a problem in which light is not emitted from the corresponding display elements 200.

The edges 18-IE and 18-OE of the power supply electrode layer 18 may be covered with the pixel-defining layer 120 or an insulating layer, the insulating layer and the pixel-defining layer 120 including the same material. Also, the second holes 18h of the power supply electrode layer 18 and edges of the second holes 18h respectively surrounding the second holes 18h may be covered with the pixel-defining layer 120 or barriers 130. The barriers 130 and the pixel-defining layer 120 may include the same material.

The edges 18-IE and 18-OE of the power supply electrode layer 18 and the edges surrounding the second holes 18h are all covered with insulating materials, thereby preventing a problem in which a portion of a material constituting the power supply electrode layer 18, for example, silver, is supplied with electrons during a manufacturing process of a display panel and is precipitated as silver. Therefore, when the edges 18-IE and 18-OE of the power supply electrode layer 18 and the edges surrounding the second holes 18h are exposed, a problem in which silver is precipitated during the manufacturing process and the precipitated silver causes a defect that generates dark spots may be prevented.

The barriers 130 may be spaced apart from each other and may be arranged to overlap the second holes 18h, respectively. When the encapsulation layer 300 is formed, the barriers 130 may serve to control a flow of the organic encapsulation layer 320 of the encapsulation layer 300.

A partition wall 140 may be arranged outside the barriers 130, that is, at a location adjacent to an edge of the substrate 100. The partition wall 140 may prevent an organic material from entering the edge of the substrate 100 when the aforedescribed organic encapsulation layer 320 is formed, thereby preventing formation of an edge tail of the organic encapsulation layer 320. The partition wall 140 may partially overlap the common power supply wire 16, for example, as illustrated in FIG. 10.

The partition wall 140 may include a first layer 141, a second layer 142, and a third layer 143. The first layer 141 and the first organic insulating layer 117 may include the same material, the second layer 142 and the second organic insulating layer 119 may include the same material, and the third layer 143 and the pixel-defining layer 120 may include the same material. The partition wall 140 may be arranged to entirely surround the display area DA to prevent the edge tail of the organic encapsulation layer 320. Therefore, the partition wall 140 may have a continuous ring shape surrounding the display area DA.

The driving circuit portion DC may be between the common power supply wire 16 and the pixel circuit PC. The driving circuit portion DC may include a first driving circuit DC1 and a second driving circuit DC2. For example, the first driving circuit DC1 may be the emission control driving circuit 13 (see FIG. 4), and the second driving circuit DC2 may be the first scan driving circuit 11 (see FIG. 4). The first driving circuit DC1 and the second driving circuit DC2 may be formed together in a formation process of the thin-film transistors TFT, the storage capacitor Cap, and various wires connected thereto of the pixel circuit PC.

The first connection wires CW1 may be between the power supply conductive layer 17 and the contact metal CM overlapping the pixel circuit PC. The first connection wires CW1 may be arranged on the first organic insulating layer 117, and the first connection wires CW1 and the power supply conductive layer 17 may include the same material. The first connection wires CW1 may be spaced apart from each other by the first gap g1.

The inorganic insulating layer 110, the protective layer 115 including an inorganic material, and the first and second inorganic encapsulation layers 310 and 330 of the encapsulation layer 300 are stacked at an end of the substrate 100, and thus impurities or moisture may be prevented from penetrating from the edge of the substrate 100.

Figure 11:
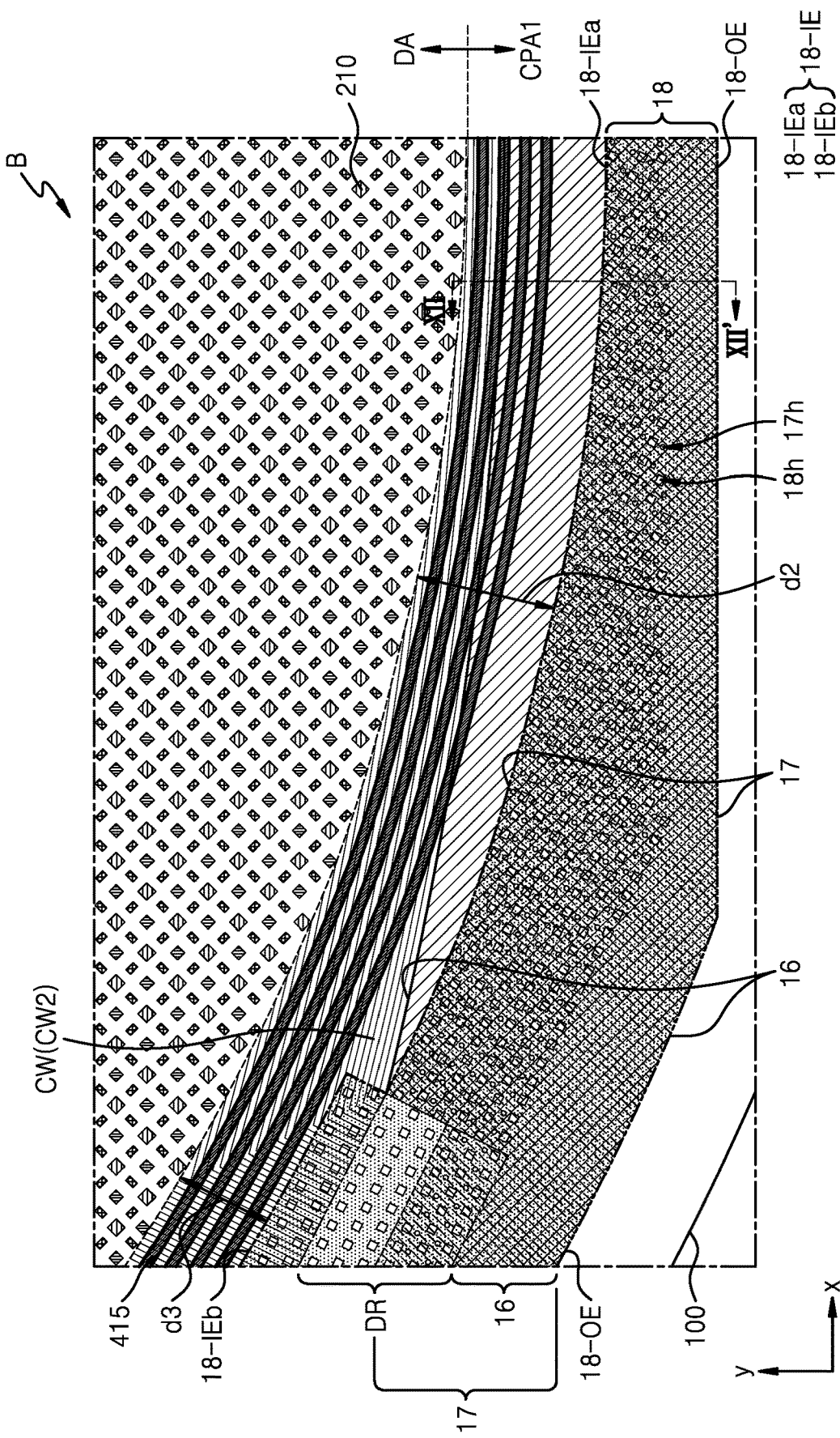
FIG. 11 is a schematic enlarged plan view of an arrangement of some elements of a display apparatus, according to an embodiment.

FIG. 11 is a schematic enlarged plan view of an arrangement of some elements of a display apparatus, according to an embodiment, and may correspond to an area B of the display panel 10 in FIG. 4. The area B in FIG. 4 may include a portion of the display area DA and a portion of the first corner peripheral area CPA1 of the peripheral area PA in the display apparatus 1. Elements that are the same as or correspond to the elements described above with reference to FIG. 10 are denoted by the same reference numerals, and detailed descriptions thereof are omitted for the brevity of the description.

Referring to FIG. 11, the driving circuit portion DC may be arranged in the peripheral area PA to be spaced apart from the display area DA. The driving circuit portion DC may not entirely surround a corner portion of the display area DA adjacent to the first corner peripheral area CPA1 but may only partially surround the corner portion. That is, one end portion of the driving circuit portion DC may be located in the first corner peripheral area CPA1. Many elements and wires, such as the pad portion 14 (see FIG. 4), the driving power supply wire 15 (see FIG. 4), the input line IPL (see FIG. 4), and the data driver 20 (see FIG. 4), may be arranged in an area arranged at an outer lower end of the display area DA, that is, the second peripheral area PA2 (see FIG. 3A) and the first and second corner peripheral areas CPA1 and CPA2 (see FIG. 3A). For this reason, there is a limitation in that the driving circuit portion DC is arranged so as to entirely surround the corner portion of the display area DA adjacent to the first corner peripheral area CPA1.

The common power supply wire 16 and the power supply conductive layer 17 extend from the second peripheral area PA2 to the first corner peripheral area CPA1 and transmit the common power voltage ELVSS. In order to minimize a voltage drop, it is necessary to reduce electrical resistance of the common power supply wire 16 and the power supply conductive layer 17. To this end, in an embodiment, a width of each of the common power supply wire 16 and the power supply conductive layer 17 in an area extending from an end portion of the driving circuit portion DC to the second peripheral area PA2 may be greater than that in the first peripheral area PA1 (see FIG. 9).

A plurality of second connection wires CW2 among the connection wires WC may be arranged in the first corner peripheral area CPA1. The second connection wires CW2 may extend from the driving circuit portion DC toward the display area DA, but at least a portion thereof may be bent. In FIG. 11, the second connection wires CW2 are indicated by thin solid lines. Because the display apparatus 1 (see FIG. 3A) is formed symmetrically, the second connection wires CW2 may also be located in the second corner peripheral area CPA2 (see FIG. 3A).

As described above, the driving circuit portion DC may partially surround the corner portion of the display area DA in the first corner peripheral area CPA1, and the corner portion of the display area DA may be round. In such a structure, in order to electrically connect the pixel circuits PC (see FIG. 4) arranged below the display area DA, for example, the pixel circuits PC arranged in an area of the display area DA adjacent to the second peripheral area PA2, and the driving circuit portion DC, at least a portion of the second connection wires CW2 may be bent to form a type of fan-out wiring structure.

The second connection wires CW2 may transmit different electrical signals, and may be arranged to be spaced apart from each other by a certain gap. However, because an area in which the second connection wires CW2 may be arranged is not sufficiently wide, the second connection wires CW2 may be arranged more densely (or compactly) compared with the first connection wires CW1 (see FIG. 9). That is, a gap between the second connection wires CW2 may be smaller than a gap between the first connection wires CW1. For example, the closer to the second peripheral area PA2 from the first corner peripheral area CPA1, the smaller the gap between the second connection wires CW2 may be.

As the gap between the second connection wires CW2 decreases, gas generated in an organic insulating layer located below the second connection wires CW2 may be difficult to be discharged to the outside. Because the second connection wires CW2 are arranged very adjacent to the display area DA, when the gas is not discharged to the outside, the possibility that the gas influences the display elements 200 of the display area DA is very high, which may cause a problem. In the case of a comparative example, the power supply electrode layer 18 is formed to cover the second connection wires CW2 which are densely arranged, and thus the problem may be further exacerbated.

According to an embodiment, in order to minimize the problem, the power supply electrode layer 18 may be formed so as not to cover a portion of the second connection wires CW2. The power supply electrode layer 18 is arranged to be spaced apart from the display area DA, but a distance therebetween may vary depending on a location thereof. In detail, on a plane, a portion 18-IEa of the inner edge 18-IE of the power supply electrode layer 18 may be spaced farther away from the display area DA than another portion 18-IEb of the inner edge 18-IE. That is, a distance d2 between the portion 18-IEa of the inner edge 18-IE of the power supply electrode layer 18 and the display area DA may be greater than a distance d3 between the other portion 18-IEb of the inner edge 18-IE and the display area DA. For example, on a plane, a space between the portion 18-IEa of the inner edge 18-IE and the display area DA may overlap a portion of the second connection wires CW2, and at the same time, may overlap a portion of the common power supply wire 16.

Though FIG. 11 illustrates that the portion 18-IEa and the other portion 18-IEb of the inner edge 18-IE of the power supply electrode layer 18 are both located in the first corner peripheral area CPA1, one or more embodiments are not limited thereto. As another example, the portion 18-IEa of the inner edge 18-IE may be located in the first corner peripheral area CPA1, whereas the other portion 18-IEb of the inner edge 18-IE may be located in the first peripheral area PA1 (see FIG. 9). In other words, on a plane, a portion of the power supply electrode layer 18 located in the first corner peripheral area CPA1 may be spaced farther away from the display area DA than a portion of the power supply electrode layer 18 located in the first peripheral area PA1. In this case, in the first corner peripheral area CPA1, on a plane, a portion of the second connection wires CW2 and a portion of the common power supply wire 16 may be located between the power supply electrode layer 18 and the display area DA.

Because the power supply electrode layer 18 is arranged below the opposite electrode 230 (see FIG. 10) and a constant voltage, that is, the common power voltage ELVSS, is applied to the opposite electrode 230, even though the power supply electrode layer 18 is removed from some areas, the touch sensitivity of the input sensing layer 40 (see FIG. 10) arranged on the opposite electrode may not be influenced.

The trace lines 415 and 425 (see FIG. 6) of the input sensing layer 40 (see FIG. 6) may be arranged adjacent to the display area DA. The space between the portion 18-IEa of the inner edge 18-IE of the power supply electrode layer 18 and the display area DA may overlap the trace lines 415 and 425 (see FIG. 6) of the input sensing layer 40. For example, as illustrated in FIG. 11, the space between the portion 18-IEa of the inner edge 18-IE of the power supply electrode layer 18 and the display area DA may overlap a portion of the first trace lines 415. Accordingly, even though the power supply electrode layer 18 does not cover a portion of the second connection wires CW2, the trace lines 415 and 425 are arranged to overlap the second connection wires CW2, and thus the visibility of the second connection wires CW2 to a user may be minimized.

Figure 12:
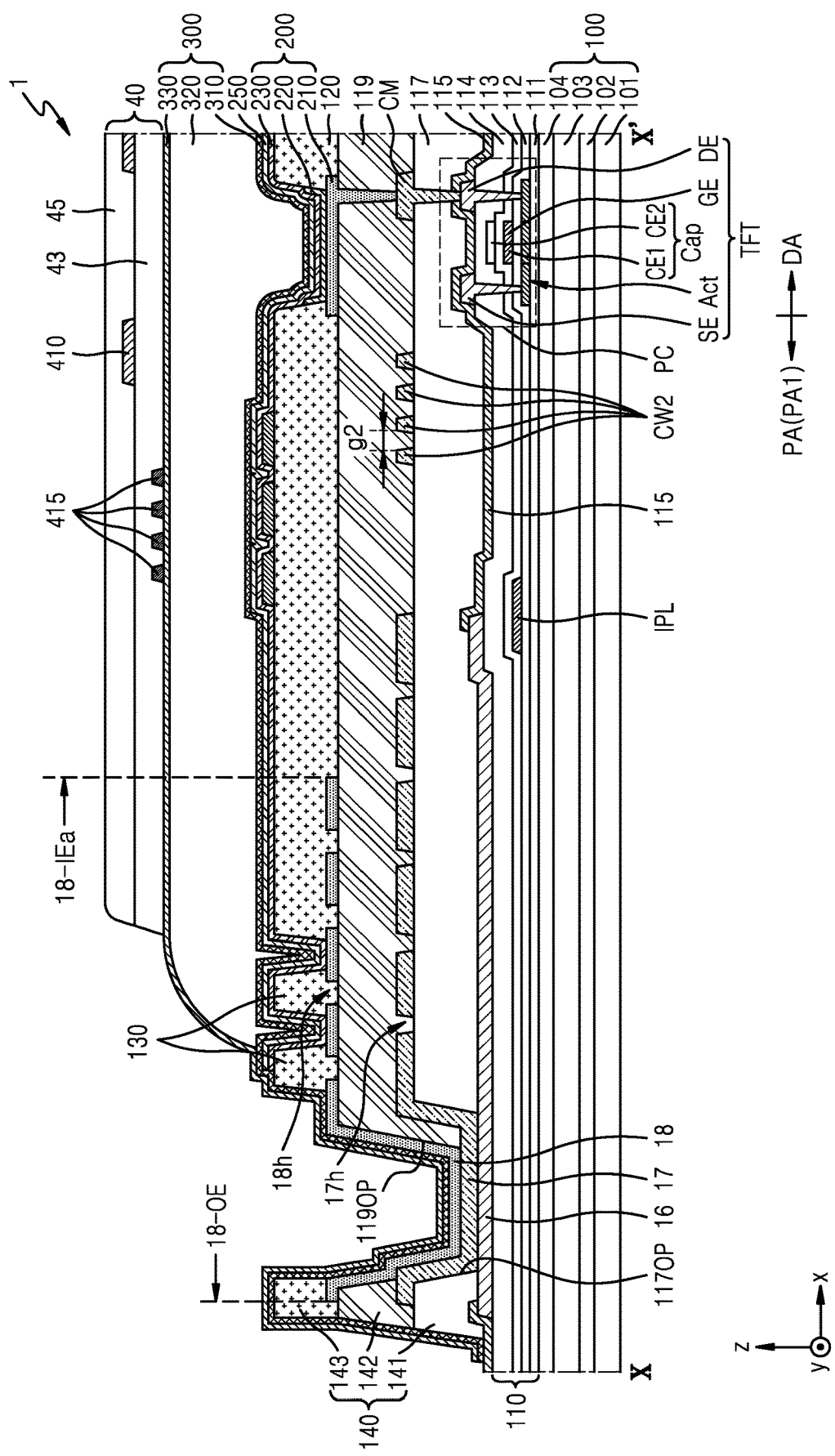
FIG. 12 is a schematic cross-sectional view of a portion of a display apparatus, according to an embodiment.

FIG. 12 is a schematic cross-sectional view of a portion of a display apparatus 1, according to an embodiment, and is a cross-sectional view of the display apparatus taken along a line XII-XII' of FIG. 11. Any redundant descriptions with the above-presented descriptions with reference to FIG. 10 are omitted, and only the differences are mainly described.

Referring to FIG. 12, the driving circuit portion DC (see FIG. 10) may not be arranged in some areas of the first corner peripheral area CPA1. A portion of the common power supply wire 16 and the input line IPL may be located in an area in which the driving circuit portion DC is not located.

In an embodiment, the second connection wires CW2 are arranged on the first organic insulating layer 117, and the second connection wires CW2 and the power supply conductive layer 17 may include the same material. The second connection wires CW2 may be arranged to be spaced apart from each other by a certain gap (i.e., a second gap g2). As described above, the second gap g2 between the second connection wires CW2 may be smaller than the first gap g1) (see FIG. 10) between the first connection wires CW1 (see FIG. 10).

In an embodiment, the portion 18-IEa of the inner edge 18-IE of the power supply electrode layer 18 may be located farther away from the display area DA than an inner edge of the common power supply wire 16 and an inner edge of the power supply conductive layer 17. In this case, the inner edge of each of the common power supply wire 16 and the power supply conductive layer 17 refers to an edge facing the display area DA. As a result, the power supply electrode layer 18 does not overlap the second connection wires CW2. Accordingly, in order to discharge gas generated in the first organic insulating layer 117 below the second connection wires CW2 to the outside, the number of conductive layers or electrode layers through which the gas needs to pass may be reduced to one. Therefore, the discharge of the gas to the outside may be improved.

The above-presented embodiments have been described with reference to FIGS. 11 and 12 based on the first corner peripheral area CPA1, but the display apparatus 1 (see FIG. 3A) is formed symmetrically, and thus the same may also apply to the second corner peripheral area CPA2.

In the above, the display apparatus is mainly described, but the disclosure is not limited thereto. For example, a method of manufacturing the display apparatus may also be within the scope of the disclosure.

According to one or more embodiments as described above, a display apparatus is provided that prevents or reduces a problem in which display quality deteriorates due to deterioration of a display element during a manufacturing process. However, the scope of the disclosure is not limited by the aforementioned effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope of the invention as defined by the following claims.

What is claimed is:

1. A display apparatus comprising:
a substrate comprising a display area and a peripheral area;
display elements disposed in the display area, each display element comprising a pixel electrode, an opposite electrode, and an intermediate layer between the pixel electrode and the opposite electrode;
a common power supply wire disposed in the peripheral area;
an organic insulating layer disposed on the substrate;
a power supply electrode layer overlapping the power supply wire and partially arranged on the organic insulating layer,
pixel circuits located in the display area, the pixel circuits electrically connect to display elements;
a driving circuit portion located in the peripheral area; and
a plurality of connection wires disposed in the peripheral area and electrically connecting the driving circuit portion to the pixel circuits,
wherein a space separates the power supply electrode layer from the display area,
the power supply electrode layer comprises an inner edge facing the display area and an outer edge opposite the inner edge,
a distance between a portion of the inner edge and the display area is greater than a distance between another portion of the inner edge and the display area,
the portion of the inner edge is located at a corner portion of the peripheral area,
the plurality of connection wires comprise:
first connection wires extending in a straight line from the driving circuit portion toward the display area; and
second connection wires extending from the driving circuit portion toward the display area, at least a portion of the second connection wires being bent, and
a gap between the second connection wires is smaller than a gap between the first connection wires.

2. The display apparatus of claim 1, wherein the power supply electrode layer and a pixel electrode of each of the plurality of display elements comprise a same material.

3. The display apparatus of claim 1, further comprising a power supply conductive layer between the power supply wire and the power supply electrode layer,
wherein the power supply conductive layer electrically connects the common power supply wire to the power supply electrode layer.

4. The display apparatus of claim 3, wherein the plurality of connection wires and the power supply conductive layer comprise a same material.

5. The display apparatus of claim 1, wherein the second connection wires are located at a corner portion of the peripheral area.

6. The display apparatus of claim 1, wherein the power supply electrode layer includes a plurality of holes arranged to overlap the organic insulating layer.

7. A display apparatus comprising:
a substrate comprising a display area and a peripheral area;
display elements disposed in the display area, each display element comprising a pixel electrode, an opposite electrode, and an intermediate layer between the pixel electrode and the opposite electrode;
a common power supply wire disposed in the peripheral area;
an organic insulating layer disposed on the substrate;
a power supply electrode layer overlapping the power supply wire and partially arranged on the organic insulating layer;
a power supply conductive layer between the power supply wire and the power supply electrode layer;
pixel circuits located in the display area, the pixel circuits electrically connect to display elements;
a driving circuit portion located in the peripheral area; and
a plurality of connection wires disposed in the peripheral area and electrically connecting the driving circuit portion to the pixel circuits,
wherein a space separates the power supply electrode layer from the display area,
the power supply electrode layer comprises an inner edge facing the display area and an outer edge opposite the inner edge,
a distance between a portion of the inner edge and the display area is greater than a distance between another portion of the inner edge and the display area, and
the portion of the inner edge is located at a corner portion of the peripheral area,
the power supply conductive layer electrically connects the common power supply wire to the power supply electrode layer,
the plurality of connection wires comprise:
first connection wires extending in a straight line from the driving circuit portion toward the display area; and
second connection wires extending from the driving circuit portion toward the display area, at least a portion of the second connection wires being bent, and
a space between the portion of the inner edge of the power supply electrode layer and the display area overlaps a portion of the second connection wires.

8. The display apparatus of claim 7, wherein the space between the portion of the inner edge of the power supply electrode layer and the display area overlaps a portion of the common power supply wire.

9. A display apparatus comprising:
a substrate comprising a display area and a peripheral area;
display elements disposed in the display area, each display element comprising a pixel electrode, an opposite electrode, and an intermediate layer between the pixel electrode and the opposite electrode;
a common power supply wire disposed in the peripheral area;
an organic insulating layer disposed on the substrate;
a power supply electrode layer overlapping the power supply wire and partially arranged on the organic insulating layer;
an encapsulation layer covering the display elements, and comprising an inorganic layer and an organic layer; and
an input sensing layer arranged on the encapsulation layer and comprising sensing electrodes and trace lines electrically connected to the sensing electrodes,
wherein a space separates the power supply electrode layer from the display area,
the power supply electrode layer comprises an inner edge facing the display area and an outer edge opposite the inner edge,
a distance between a portion of the inner edge and the display area is greater than a distance between another portion of the inner edge and the display area,
the portion of the inner edge is located at a corner portion of the peripheral area, and a space between the portion of the inner edge of the power supply electrode layer and the display area overlaps a portion of the trace lines of the input sensing layer.

10. A display apparatus comprising:
a substrate comprising a display area and a peripheral area;
a common power supply wire disposed in the peripheral area;
an organic insulating layer disposed on the substrate;
a power supply electrode layer disposed in the peripheral area and overlapping the organic insulating layer, the power supply electrode layer is spaced apart from the display area on a plane;
a plurality of display elements arranged on the substrate and each comprising a pixel electrode, an opposite electrode, and an intermediate layer between the pixel electrode and the opposite electrode;
an encapsulation layer covering the plurality of display elements;
an input sensing layer arranged on the encapsulation layer and comprising sensing electrodes and trace lines electrically connected to the sensing electrodes;
a driving circuit portion arranged in the peripheral area, at least a portion of the driving circuit portion being located in the corner peripheral area; and
connection wires extending from the driving circuit portion toward the display area,
wherein the peripheral area comprises a first peripheral area extending in a first direction, a second peripheral area extending in a second direction intersecting with the first direction, and a corner peripheral area connecting the first peripheral area and the second peripheral area with each other,
wherein, on a plane, at least a portion of the power supply electrode layer located in the corner peripheral area is spaced farther away from the display area than a portion of the power supply electrode layer located in the first peripheral area,
wherein the plurality of connection wires comprise first connection wires extending in a straight line and second connection wires that are at least partially bent and located in the corner peripheral area, and
wherein a gap between the second connection wires of the plurality of connection wires is smaller than a gap between the first connection wires of the plurality of connection wires.

11. The display apparatus of claim 10, wherein the power supply electrode layer and a pixel electrode of each of the plurality of display elements comprise a same material.

12. A display apparatus comprising:
a substrate comprising a display area and a peripheral area;
a common power supply wire disposed in the peripheral area;
an organic insulating layer disposed on the substrate;
a power supply electrode layer disposed in the peripheral area and overlapping the organic insulating layer, the power supply electrode layer is spaced apart from the display area on a plane;
a plurality of display elements arranged on the substrate and each comprising a pixel electrode, an opposite electrode, and an intermediate layer between the pixel electrode and the opposite electrode;
an encapsulation layer covering the plurality of display elements;
an input sensing layer arranged on the encapsulation layer and comprising sensing electrodes and trace lines electrically connected to the sensing electrodes;
a driving circuit portion arranged in the peripheral area, at least a portion of the driving circuit portion being located in the corner peripheral area; and
connection wires extending from the driving circuit portion toward the display area,
wherein the peripheral area comprises a first peripheral area extending in a first direction, a second peripheral area extending in a second direction intersecting with the first direction, and a corner peripheral area connecting the first peripheral area and the second peripheral area with each other,
wherein, on a plane, at least a portion of the power supply electrode layer located in the corner peripheral area is spaced farther away from the display area than a portion of the power supply electrode layer located in the first peripheral area,
wherein the plurality of connection wires comprise first connection wires extending in a straight line and second connection wires that are at least partially bent and located in the corner peripheral area, and
wherein, on a plane, a portion of second connection wires and a portion of the common power supply wire are located between at least a portion of the power supply electrode layer and the display area.

13. A display apparatus comprising:
a substrate comprising a display area and a peripheral area;
a common power supply wire disposed in the peripheral area;
an organic insulating layer disposed on the substrate;
a power supply electrode layer disposed in the peripheral area and overlapping the organic insulating layer, the power supply electrode layer is spaced apart from the display area on a plane;
a plurality of display elements arranged on the substrate and each comprising a pixel electrode, an opposite electrode, and an intermediate layer between the pixel electrode and the opposite electrode;
an encapsulation layer covering the plurality of display elements; and
an input sensing layer arranged on the encapsulation layer and comprising sensing electrodes and trace lines electrically connected to the sensing electrodes,
wherein the peripheral area comprises a first peripheral area extending in a first direction, a second peripheral area extending in a second direction intersecting with the first direction, and a corner peripheral area connecting the first peripheral area and the second peripheral area with each other,
wherein, on a plane, at least a portion of the power supply electrode layer located in the corner peripheral area is spaced farther away from the display area than a portion of the power supply electrode layer located in the first peripheral area, and
wherein, on a plane, a portion of the trace lines of the input sensing layer is located between at least a portion of the power supply electrode layer and the display area.

14. The display apparatus of claim 13, further comprising:
a driving circuit portion arranged in the peripheral area, at least a portion of the driving circuit portion being located in the corner peripheral area; and
connection wires extending from the driving circuit portion toward the display area, wherein the plurality of connection wires comprise first connection wires extending in a straight line and second connection wires that are at least partially bent and located in the corner peripheral area.

* * * * *